: US 11,970,387 B2
(45) Date of Patent: Apr. 30, 2024

(12) United States Patent
Cheng et al.

(54) MICRO-ELECTRO MECHANICAL SYSTEM DEVICE CONTAINING A BUMP STOPPER AND METHODS FOR FORMING THE SAME

(71) Applicant: Taiwan Semiconductor Manufacturing Company Limited, Hsinchu (TW)

(72) Inventors: Chun-wen Cheng, Zhubei (TW); Chi-Hang Chin, New Taipei (TW); Kuei-Sung Chang, Kaohsiung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 72 days.

(21) Appl. No.: 17/699,245

(22) Filed: Mar. 21, 2022

(65) Prior Publication Data

US 2022/0212917 A1  Jul. 7, 2022

Related U.S. Application Data

(63) Continuation of application No. 16/715,131, filed on Dec. 16, 2019, now Pat. No. 11,279,611.

(51) Int. Cl.
*B81B 3/00* (2006.01)
*B81C 1/00* (2006.01)

(52) U.S. Cl.
CPC .......... *B81B 3/001* (2013.01); *B81C 1/00968* (2013.01); *B81C 2201/013* (2013.01)

(58) Field of Classification Search
CPC ... B81B 3/001; B81B 2201/0235; B81B 7/02; B81B 7/0032; B81B 2203/033; B81B 2203/04; B81C 1/00968; B81C 2201/013; B81C 2203/0109; B81C 2203/036; B81C 1/00198; B81C 1/0096; B81C 1/00261; G01C 19/5769; G01P 15/125; G01P 2015/0871; G01P 2015/088
See application file for complete search history.

(56) References Cited

U.S. PATENT DOCUMENTS

2007/0099395 A1    5/2007  Sridhar et al.
2011/0133295 A1*   6/2011  Fujii ...................... H01L 24/73
                                                    257/E21.546
(Continued)

FOREIGN PATENT DOCUMENTS

KR    10-2019-0003284 A    1/2019

*Primary Examiner* — Yasser A Abdelaziez
(74) *Attorney, Agent, or Firm* — The Marbury Law Group, PLLC

(57) ABSTRACT

A micro-electro mechanical system (MEMS) device includes a MEMS substrate, at least one movable element laterally confined within a matrix layer that overlies the MEMS substrate, and a cap substrate bonded to the matrix layer through bonding material portions. A first movable element selected from the at least one movable element is located inside a first chamber that is laterally bounded by the matrix layer and vertically bounded by a first capping surface that overlies the first movable element. The first capping surface includes an array of downward-protruding bumps including respective portions of a dielectric material layer. Each of the downward-protruding bumps has a vertical cross-sectional profile of an inverted hillock. The MEMS device can include, for example, an accelerometer.

20 Claims, 23 Drawing Sheets

(56) References Cited

U.S. PATENT DOCUMENTS

| | | | |
|---|---|---|---|
| 2016/0318753 A1* | 11/2016 | Chou | B81C 1/00952 |
| 2016/0355394 A1* | 12/2016 | Tseng | B81B 7/0041 |
| 2018/0099865 A1 | 4/2018 | Hsieh et al. | |
| 2018/0305201 A1 | 10/2018 | Chu et al. | |
| 2019/0002273 A1 | 1/2019 | Chang et al. | |

* cited by examiner

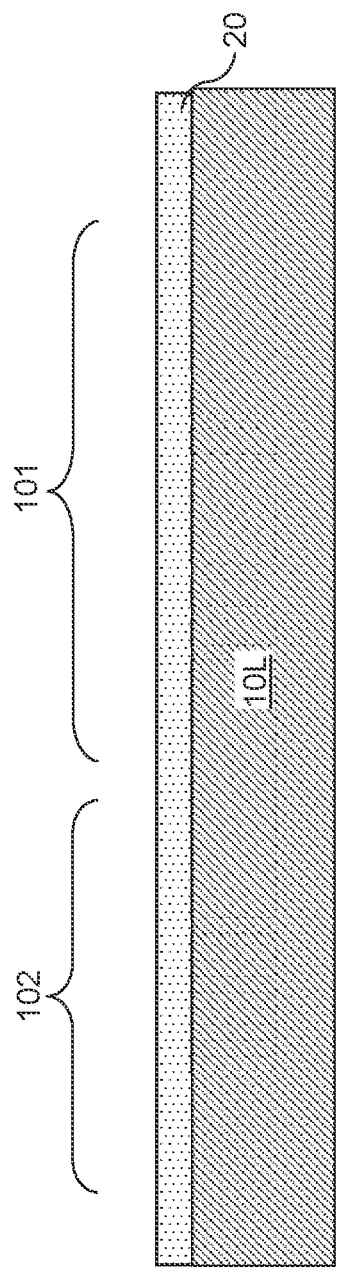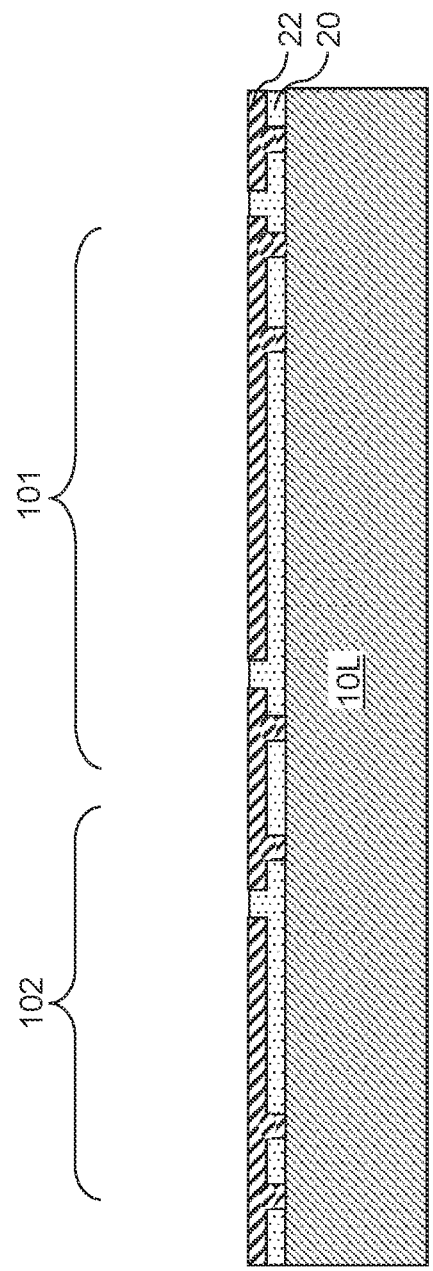

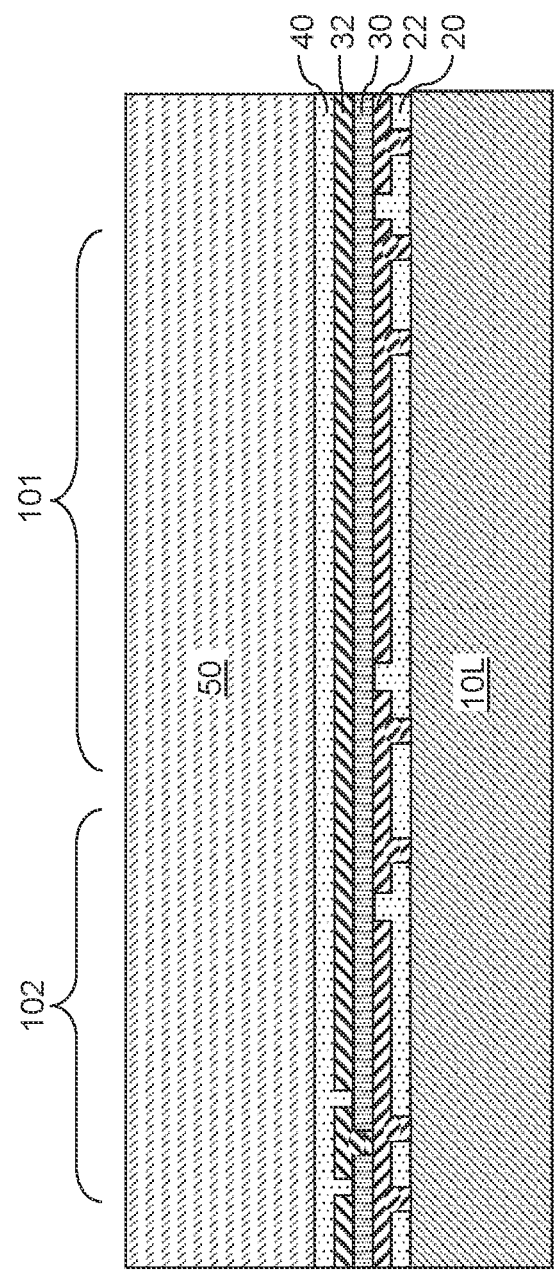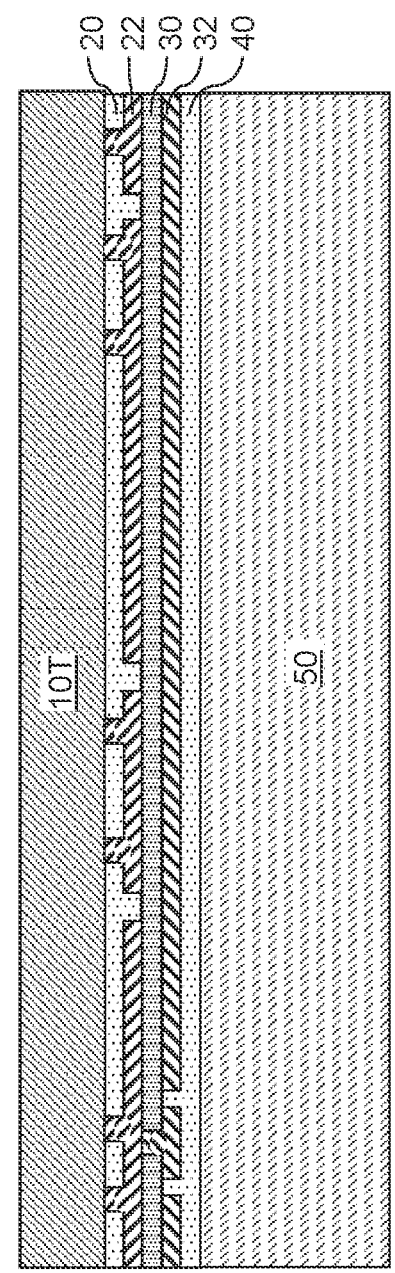

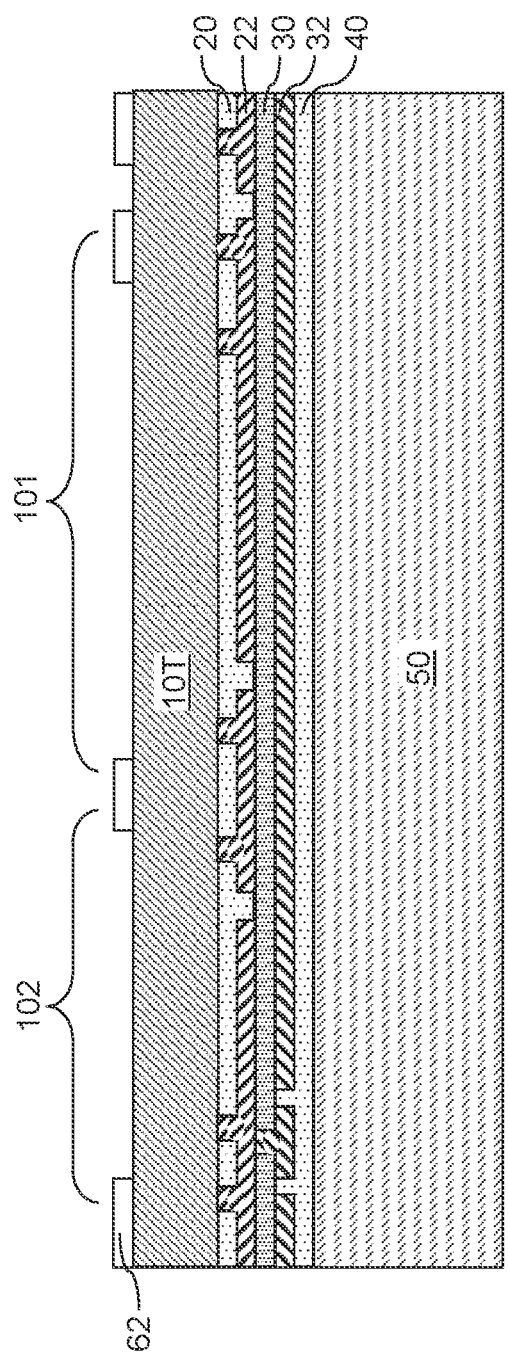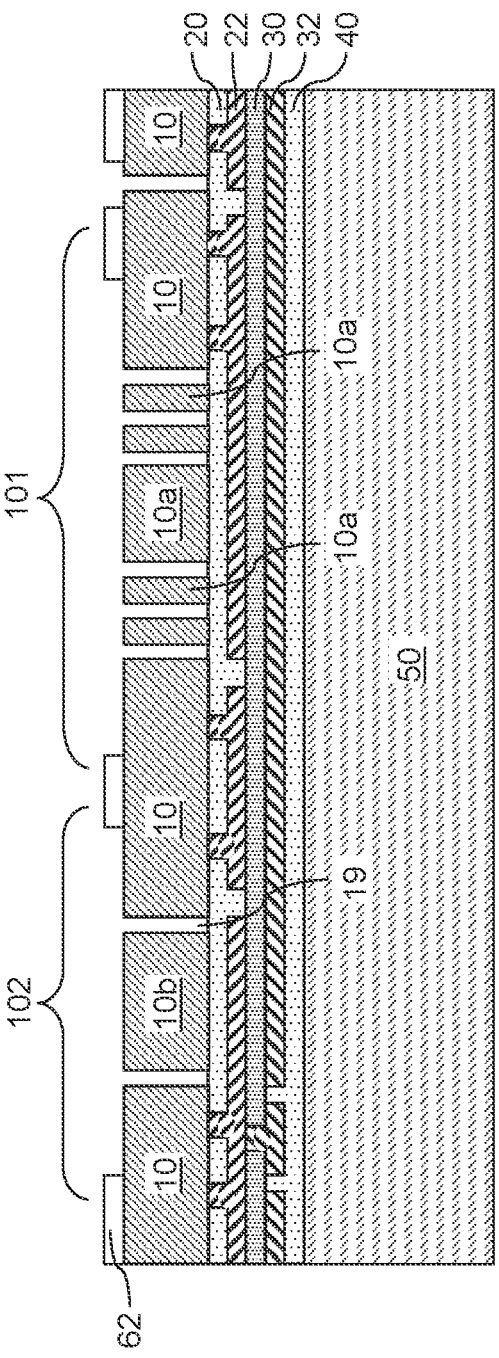

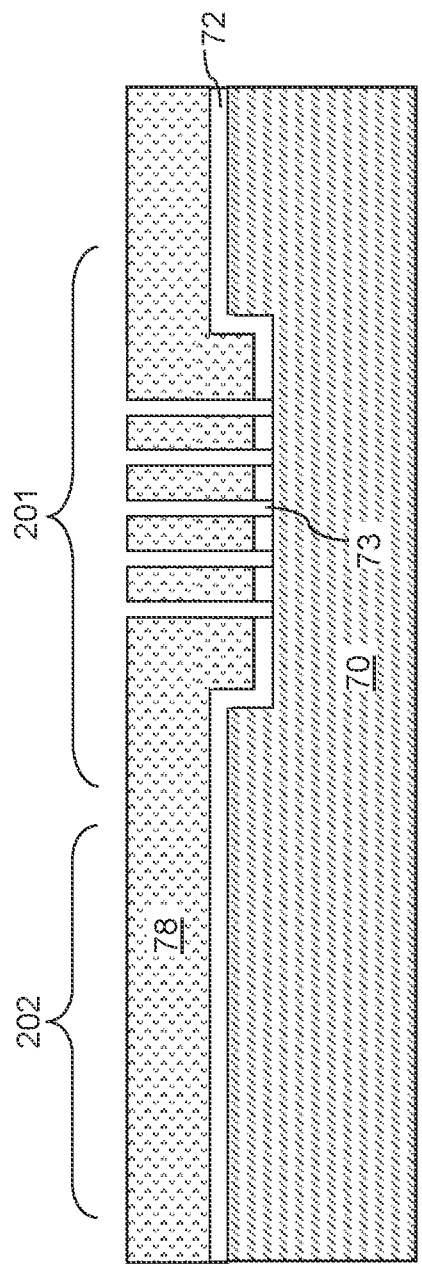
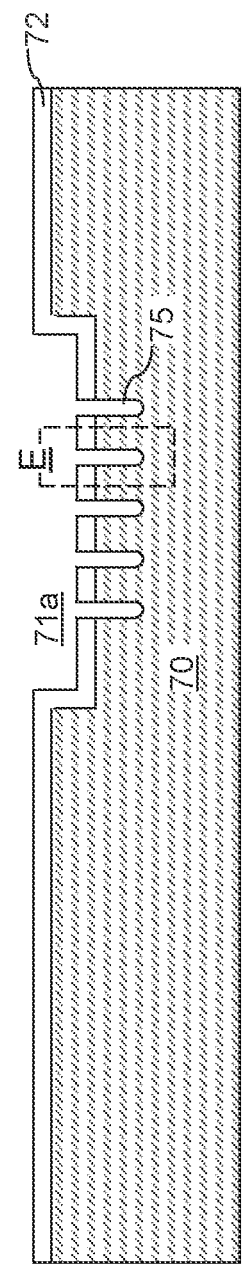
FIG. 2C
FIG. 2D

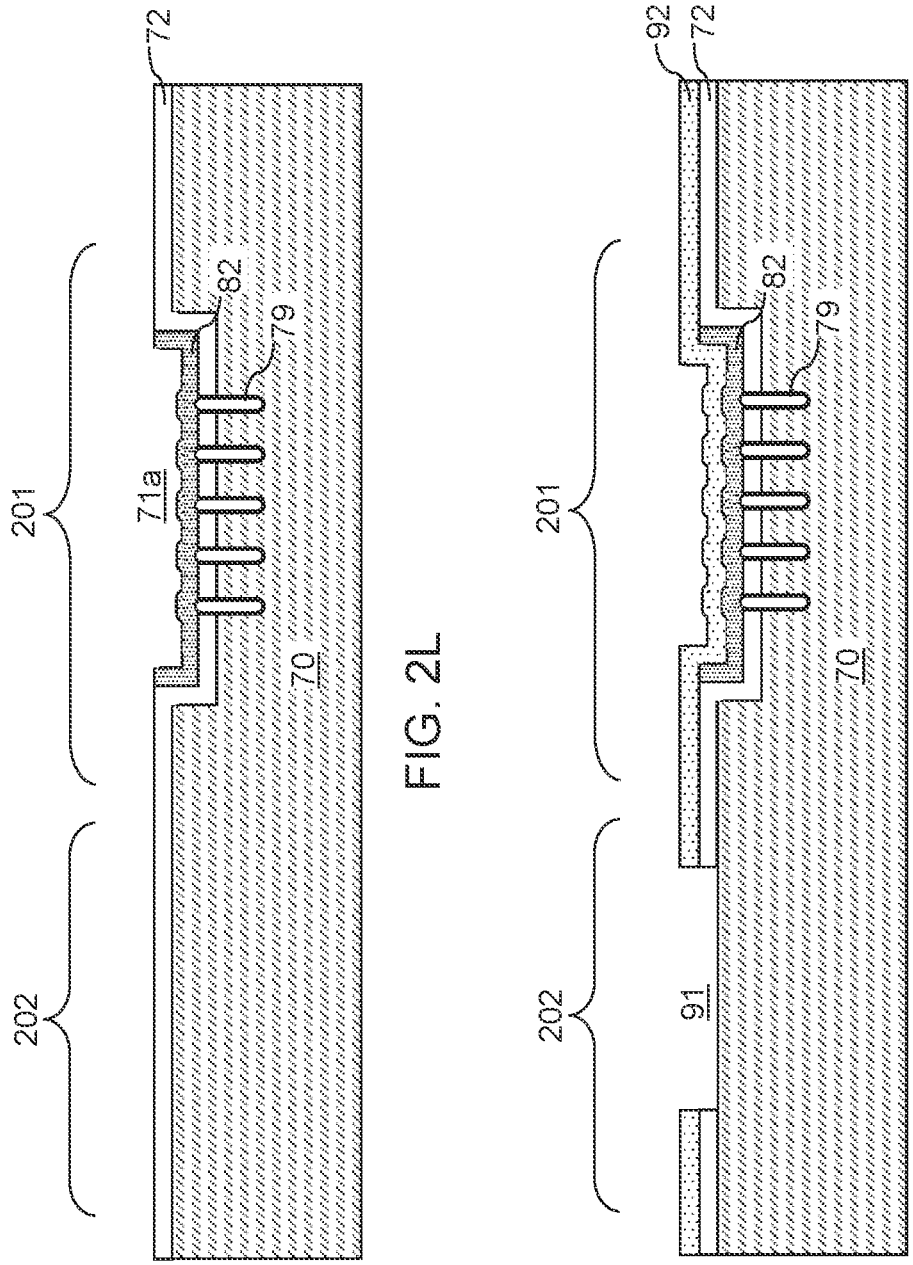

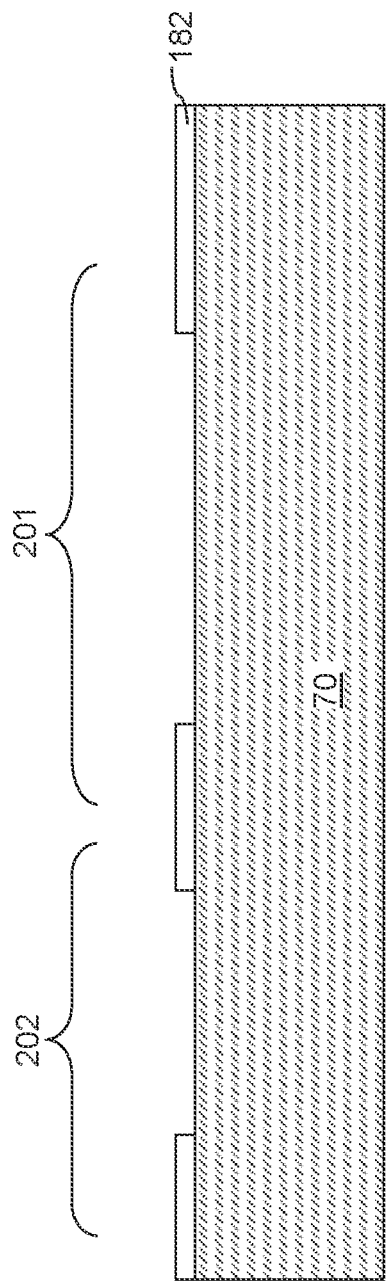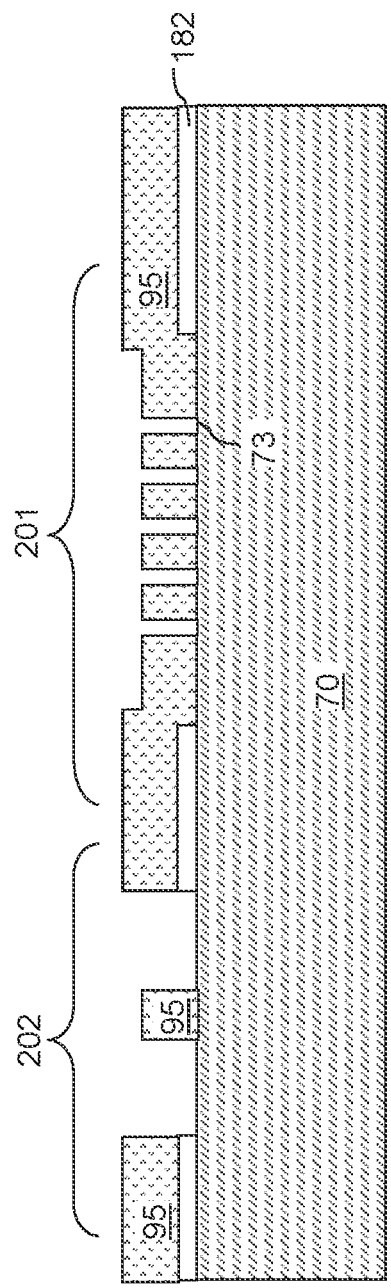
FIG. 4A
FIG. 4B

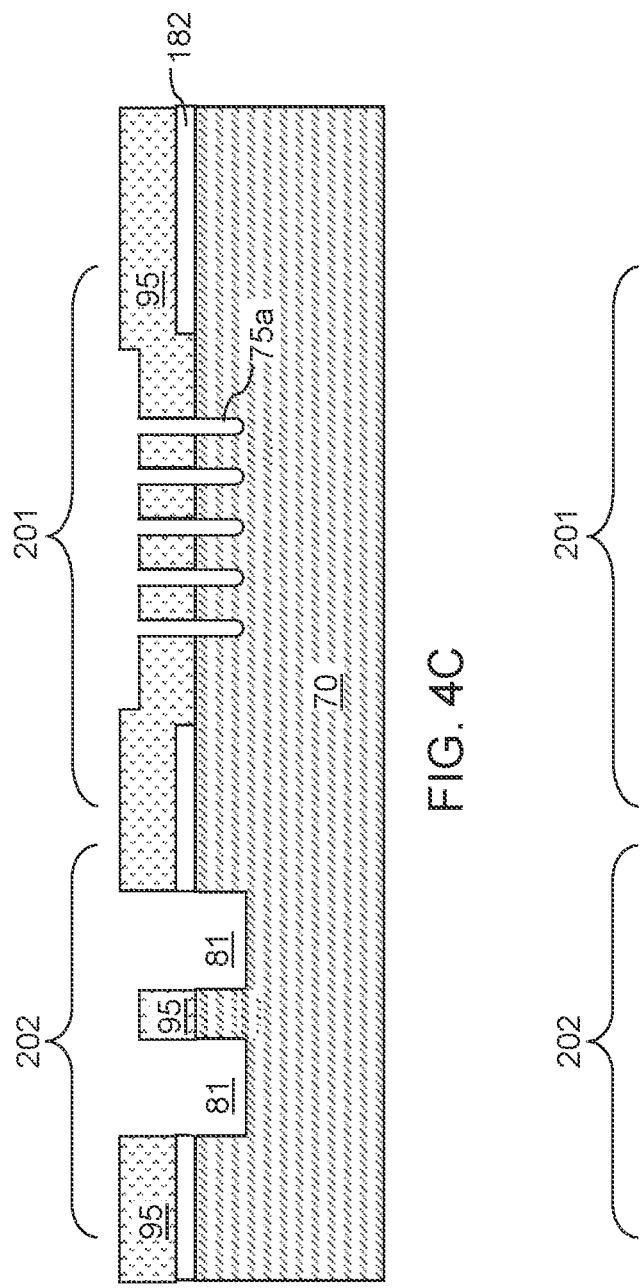
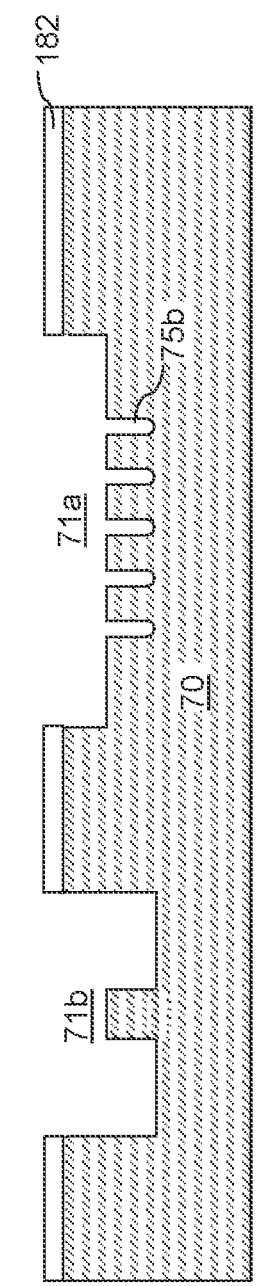
FIG. 4C
FIG. 4D

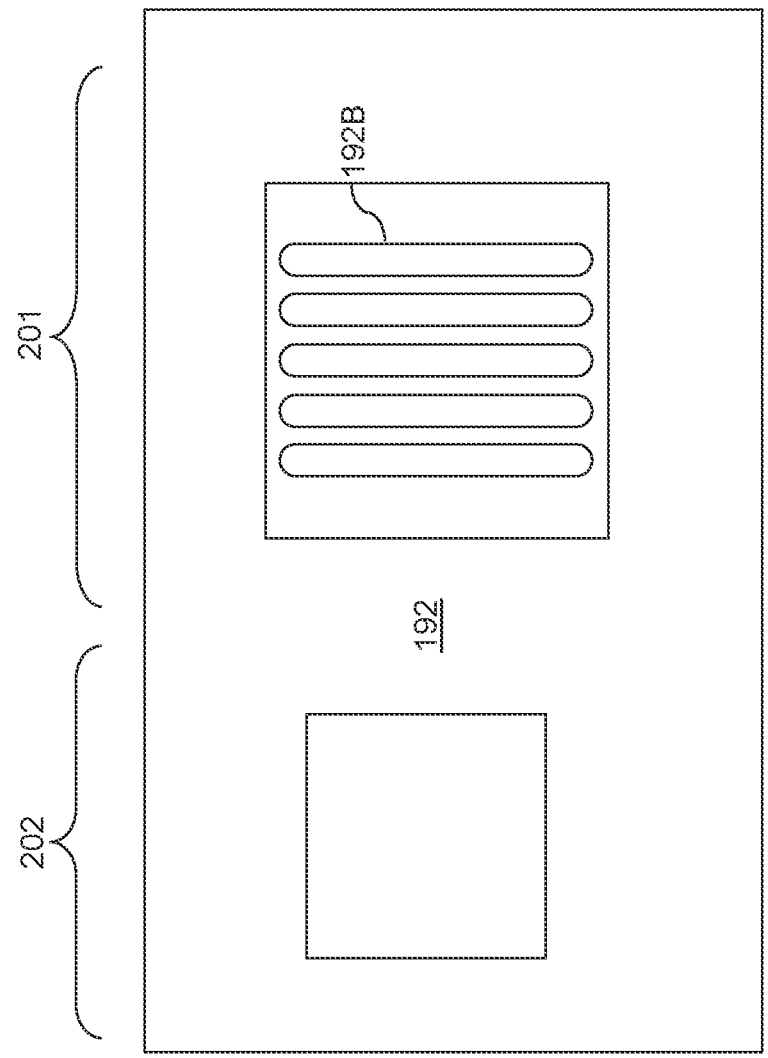
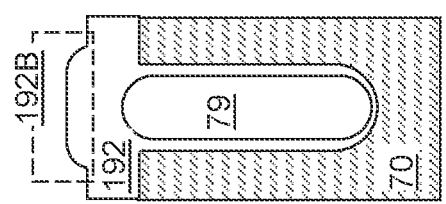
FIG. 4G
FIG. 4F

MICRO-ELECTRO MECHANICAL SYSTEM DEVICE CONTAINING A BUMP STOPPER AND METHODS FOR FORMING THE SAME

RELATED APPLICATIONS

This application is a continuation of U.S. patent application Ser. No. 16/715,131 entitled "Micro-Electro Mechanical System Device Containing a Bump Stopper and Methods for Forming the Same" filed Dec. 16, 2019, the contents of which is incorporated herein by reference in its entirety.

BACKGROUND

Micro-electro mechanical system (MEMS) devices include devices fabricated using semiconductor technology to form mechanical and electrical features. MEMS devices may include moving parts having dimensions of microns or sub-microns and a mechanism for electrically coupling the moving parts to an electrical signal, which may be an input signal that induces movement of the moving parts or an output signal that is generated by the movement of the moving parts. MEMS devices are useful devices that may be integrated with other devices, such as semiconductor devices, to function as sensors or as actuators.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2C is a vertical cross-sectional view of the first exemplary structure after formation of openings through the cap-side bonding dielectric layer in the first recess region in accordance with an embodiment of the present disclosure.

FIG. 2D is a vertical cross-sectional view of the first exemplary structure after formation of trenches underneath the openings through the cap-side bonding dielectric layer in accordance with an embodiment of the present disclosure.

FIG. 2L is a vertical cross-sectional view of the first exemplary structure after removal of a top horizontal portion of the bump-containing material layer in accordance with an embodiment of the present disclosure.

FIG. 2M is a vertical cross-sectional view of the first exemplary structure after formation of a first etch mask layer and an opening in the cap-side bonding dielectric layer in accordance with an embodiment of the present disclosure.

FIG. 4A is a vertical cross-sectional view of a second exemplary structure for forming a cap structure after formation of a patterned hard mask layer in accordance with an embodiment of the present disclosure.

FIG. 4B is a vertical cross-sectional view of the second exemplary structure after formation of a patterned etch mask layer in accordance with an embodiment of the present disclosure.

FIG. 4C is a vertical cross-sectional view of the second exemplary structure after formation of first trenches and an in-process recess region in accordance with an embodiment of the present disclosure.

FIG. 4D is a vertical cross-sectional view of the second exemplary structure after formation of a first recess region and second trenches vertically extending therefrom and after formation of a second recess region in accordance with an embodiment of the present disclosure.

FIG. 4F is a magnified view of the region F in FIG. 4E.

FIG. 4G is a top-down view of the first configuration of the second exemplary structure of FIG. 4E.

DETAILED DESCRIPTION

Figure 1C:
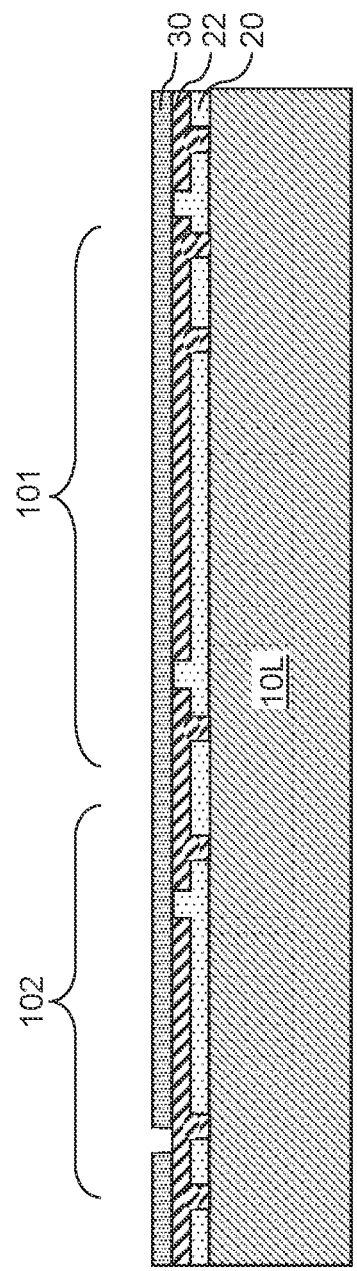
FIG. 1C is a vertical cross-sectional view of the exemplary structure after formation of a second dielectric material layer in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to micro-electro mechanical system (MEMS) device containing a bump stopper structure and method for forming the same. Some MEMS devices may include a MEMS assembly layer and a cap structure layer. The MEMS assembly may include a moving plate (i.e., movable elements) or sensing element that registers the acceleration of the device or angular velocity of the device. At times, since the moving plate in the MEMS assembly is in the micrometer scale, the moving plate may adhere due to stiction to the complementary cap structure that contains the moving plate in conjunction with the MEMS assembly. In situations where two surfaces with areas below the micrometer scale come into close proximity (as in an accelerometer), they may adhere together. At this scale, electrostatic and/or Van der Waals and hydrogen bonding forces become significant. The phenomenon of two such surfaces being adhered together in this manner is also called stiction. Stiction may be related to hydrogen bonding or residual contamination. Various embodiments described herein provide bump structures in the cap structure. The bump structures reduce the surface area of the cap structure that may contact the moving plate of the MEMS assembly. By reducing the surface area of the contacting surface the potential for stiction may also be reduced.

Referring to FIG. 1A, an exemplary structure for forming a MEMS assembly in accordance with an embodiment of the present disclosure is illustrated. The exemplary structure includes a matrix material layer 10L. The matrix material layer 10L may include a first semiconductor material, which may include silicon, germanium, a silicon-germanium alloy, or a compound semiconductor material that can be doped to locally alter electrical conductivity or other suitable materials that are within the contemplated scope of disclosure. In one embodiment, the matrix material layer 10L may have a thickness in a range from 30 microns to 1 mm, although lesser and greater thicknesses can also be used. In one embodiment, an upper portion of the matrix material layer 10L may include a hydrogen-implanted layer to enable subsequent cleaving of a lower portion of the matrix material layer 10L. In this case, the depth of the hydrogen-implanted layer from the top surface of the matrix material layer 10L may be in a range from 100 nm to 3 microns, such as from 300 nm to 1,000 nm, although lesser and greater depths can also be used. The exemplary structure may include various regions for forming various devices that includes at least one micro-electro mechanical system (MEMS) device. For example, the exemplary structure may include a first device region 101 and a second device region 102. In a non-limiting illustrative example, components for an accelerometer for measuring linear acceleration may be formed in the first device region 101 and a gyroscope for measuring angular velocity may be formed in the second device region 102. In other non-limiting embodiments, a structure may be formed with repetitive first device regions 101 or second device regions 102 to form a plurality of the same type of sensor.

A first dielectric material layer 20 may be formed over the top surface of the matrix material layer 10L. The first dielectric material layer 20 may include a dielectric material such as silicon oxide, silicon nitride, organosilicate glass, a porous low-k dielectric material, or a spin-on glass (SOG) material. Other suitable materials within the contemplated scope of disclosure may also be used. The first dielectric material layer 20 may be deposited by chemical vapor deposition, physical vapor deposition, or spin-on coating. The thickness of the first dielectric material layer 20 can be in a range from 100 nm to 600 nm, although lesser and greater thicknesses can also be used. In one embodiment, the first dielectric material layer 20 may include densified undoped silicate glass material formed by decomposition of tetraethylorthosilicate (TEOS).

Referring to FIG. 1B, the first dielectric material layer 20 may be patterned by a combination of lithographic processes and at least one etch process to form various cavities, which may include line cavities and via cavities. For example, a first photoresist layer (not shown) can be applied over the first dielectric material layer 20, and can be lithographically patterned to form via openings therethrough. A first anisotropic etch can be performed to transfer the pattern of the via openings through an upper portion of the first dielectric material layer 20 to form via cavities. The first photoresist layer can be removed, and a second photoresist layer (not shown) may be applied over the first dielectric material layer 20. The second photoresist layer can be lithographically patterned to form line-shaped opening therethrough. A second anisotropic etch process can be performed to transfer the pattern of the line-shaped openings through the upper portion of the first dielectric material layer 20 to form line cavities, and to extend the via cavities to the top surface of the matrix material layer 10L. The second photoresist layer can be removed, for example, by ashing or other suitable processes. At least one conductive material 22 may be deposited in the via cavities and the line cavities. Excess portions of the at least one conductive material 22 may be removed from above a horizontal plane including a top surface of the first dielectric material layer 20. Remaining portions of the at least one conductive material in the first dielectric material layer 20 constitute first conductive structures 22. The first conductive structures 22 can include a doped semiconductor material (such as doped polysilicon), or a metallic material such as an elemental metal, an intermetallic alloy, a conductive metallic nitride material, or a metal-semiconductor compound (such as a metal silicide).

Referring to FIG. 1C, a second dielectric material layer 30 may be deposited over the first conductive structures 22 and first dielectric material layer 20. The second dielectric material layer 30 may include a dielectric material such as silicon oxide, silicon nitride, organosilicate glass, a porous low-k dielectric material, or a spin-on glass (SOG) material. Other suitable materials within the contemplated scope of disclosure may also be used. The second dielectric material layer 30 can be deposited by chemical vapor deposition, physical vapor deposition, or spin-on coating. The thickness of the second dielectric material layer 30 can be in a range from 100 nm to 600 nm, although lesser and greater thicknesses can also be used. In one embodiment, the second dielectric material layer 30 may include a layer stack including multiple dielectric material layers that include an etch stop layer such as a silicon nitride layer or an aluminum oxide layer. In case a layer stack is used for the second dielectric material layer 30, an upper layer within the layer stack can include densified undoped silicate glass material formed by decomposition of tetraethylorthosilicate (TEOS). The second dielectric material layer 30 may be patterned to form various via cavities. A top surface of a respective first conductive structure 22 may be physically exposed at the bottom of each via cavity through the second dielectric material layer 30.

Figure 1D:
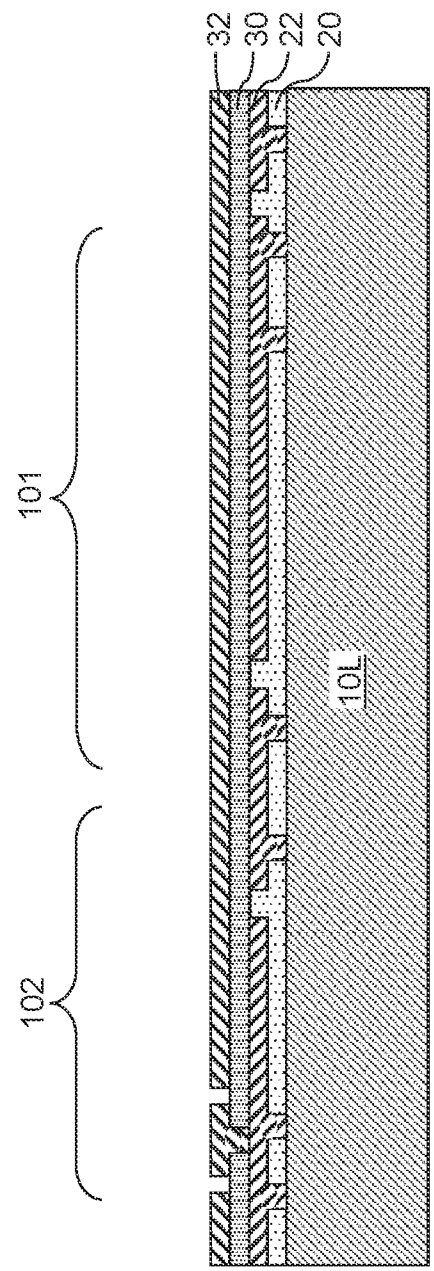
FIG. 1D is a vertical cross-sectional view of the exemplary structure after formation of a second conductive material layer in accordance with an embodiment of the present disclosure.
Figure 1:
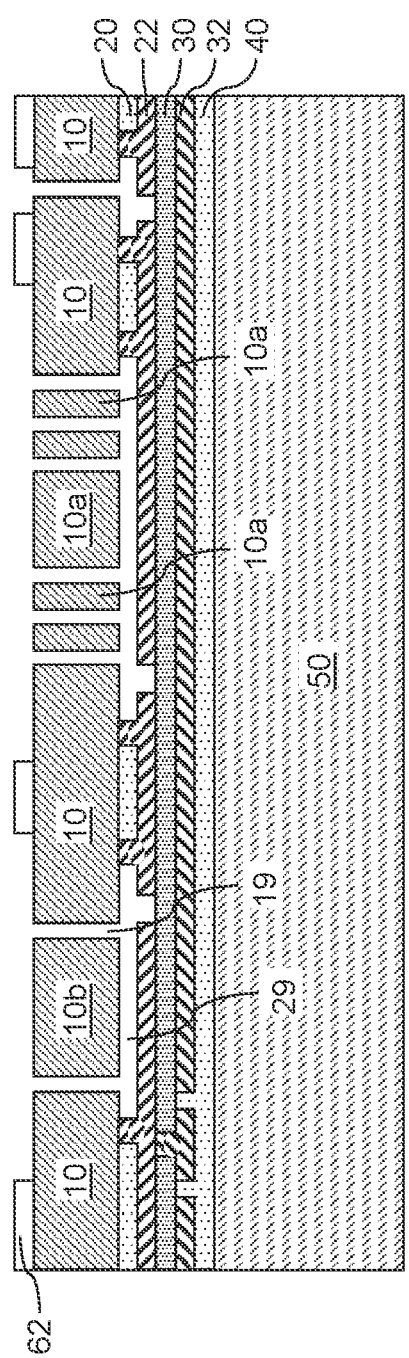
FIG. 1A is a vertical cross-sectional view of an exemplary structure for forming a MEMS structure after formation of a first dielectric material layer over a matrix material layer in accordance with an embodiment of the present disclosure.
FIG. 1B is a vertical cross-sectional view of the exemplary structure after formation of a first conductive material layer in accordance with an embodiment of the present disclosure.
FIG. 1E is a vertical cross-sectional view of the exemplary structure after formation of a third dielectric material layer and attachment of a MEMS substrate in accordance with an embodiment of the present disclosure.
FIG. 1F is a vertical cross-sectional view of the exemplary structure after thinning the matrix material layer in accordance with an embodiment of the present disclosure.
FIG. 1G is a vertical cross-sectional view of the exemplary structure after forming a matrix-side bonding dielectric layer in accordance with an embodiment of the present disclosure.
FIG. 1H is a vertical cross-sectional view of the exemplary structure after patterning the matrix material layer into movable elements and a matrix layer in accordance with an embodiment of the present disclosure.
FIG. 1I is a vertical cross-sectional view of the exemplary structure after detaching the movable elements from the first dielectric material layer by removing portions of the first dielectric material layer in accordance with an embodiment of the present disclosure.

Referring to FIG. 1D, at least one conductive material may be deposited in the via cavities through and over the second dielectric material layers 30. The at least one conductive material may be patterned, for example, by applying and patterning a photoresist layer above the at least one conductive material, and by transferring the pattern of the photoresist layer through the at least one conductive material. The photoresist layer may be subsequently removed, for example, by ashing or other suitable processes. Remaining patterned portions of the at least one conductive material may constitute second conductive structures 32. The second conductive structures 32 may include a doped semiconductor material (such as doped polysilicon), or a metallic material such as an elemental metal, an intermetallic alloy, a conductive metallic nitride material, or a metal-semiconductor compound (such as a metal silicide).

Generally, at least one level of conductive structures (22, 32) may be formed over or within a respective dielectric material layer (20, 30) over the matrix material layer 10L. Various patterning methods may be used to form the combination of the at least one level of conductive structures (22, 32) and the at least one dielectric material layer (20, 30). Such patterning methods include, but are not limited to, single damascene patterning methods, dual damascene patterning methods, layer deposition and patterning methods, etc. In case a hydrogen-implanted layer (not shown) is present in the matrix material layer 10L, the processing temperature may be selected below a temperature at which hydrogen atoms within the hydrogen-implanted layer may permit cleaving (which can occur in a temperature range from 500 degrees Celsius to 600 degrees Celsius). While only two levels conductive structures (22, 32) are described herein, it is understood that as many levels of conductive structures may be formed in embodiment structures as needed. The pattern of the conductive structures (22, 32) may be optimized to enable functionality of the various MEMS devices to be subsequently formed.

Referring to FIG. 1E, a dielectric material layer may be deposited over the topmost conductive structures (such as the second conductive structures 32). The deposited dielectric material layer is herein referred to as a distal dielectric material layer or a third dielectric material layer 40 (in embodiments in which the deposited dielectric material layer is formed on the second conductive structures 32). In one embodiment, the deposited dielectric material layer can be a silicon oxide layer having a thickness in a range from 100 nm to 1,000 nm.

A substrate may be formed over or attached to a top surface of the third dielectric material layer 40. The attached substrate may be a handle substrate that is subsequently used to provide mechanical support to the underlying material layers including the matrix material layer 10L, the first dielectric material layer 20, the first conductive structures 22, the second dielectric material layer 30, the second conductive structures 22, and the third dielectric material layer 40. The attached substrate is herein referred to as a MEMS substrate 50 in view of subsequently patterning of the matrix material layer into movable elements for MEMS devices. The MEMS substrate 50 may have a thickness in a range from 30 microns to 3 mm, such as from 100 microns to 1 mm, although lesser and greater thicknesses may also be used. The MEMS substrate 50 may be a semiconductor substrate, a conductive substrate, an insulating substrate, or a composite substrate including multiple layers. In one embodiment, the MEMS substrate 50 can be a semiconductor substrate such as a commercially available silicon substrate. The MEMS substrate 50 may be formed over or attached to the third dielectric material layer 40, for example, using oxide-to-semiconductor bonding.

Referring to FIG. 1F, the matrix material layer 10L may be thinned to provide a thinned matrix material layer 10T. The thickness of the thinned matrix material layer 10T may be in a range from 100 nm to 10 microns, such as from 300 nm to 5 microns, although lesser and greater thicknesses can also be used. In one embodiment, the thinning of the matrix material layer 10L can be performed by grinding, polishing, an isotropic etch process, an anisotropic etch process, or a combination thereof. In embodiments in which a hydrogen-implanted layer may be provided within the matrix material layer 10L, a cleaving process may be used to remove distal portions of the matrix material layer 10L that are more distal from the MEMS substrate 50 than the hydrogen-implanted layer. An anneal at an elevated process in a range from 500 degrees Celsius to 600 degrees Celsius may be performed for the cleaving process to induce bubbling of hydrogen atoms at the level of the hydrogen-implanted layer within the matrix material layer 10L. The exemplary structure can be subsequently flipped such that the thinned matrix material layer 10T faces up and the MEMS substrate 50 faces down.

Referring to FIG. 1G, a bonding material may be deposited on a top surface of the thinned matrix material layer 10T to form a bonding dielectric layer, which is herein referred to as a matrix-side bonding dielectric layer 62. The bonding material of the matrix-side bonding dielectric layer 62 may include silicon oxide, a polymer material, or a dielectric adhesive material. In one embodiment, the matrix-side bonding dielectric layer 62 includes silicon oxide and has a thickness in a range from 100 nm to 1,000 nm, although lesser and greater thicknesses can also be used. The matrix-side bonding dielectric layer 62 may be patterned such that openings may be formed in areas (e.g., regions 101 and 102) in which movable elements are to be subsequently patterned out of the thinned matrix material layer 10T and in areas in which etchant access holes are to be subsequently formed through the thinned matrix material layer 10T.

Referring to FIG. 1H, a photoresist layer (not shown) may be applied over the thinned matrix material layer 10T and the matrix-side bonding dielectric layer 62, and may be lithographically patterned to form openings in areas that define gaps 19 between movable elements and a matrix layer to be subsequently patterned from the thinned matrix material layer 10T. In other words, the pattern of the openings in the photoresist layer can include the pattern of the gaps 19 between the movable elements and the matrix layer to be subsequently patterned from the thinned matrix material layer 10T. Further, the pattern of the openings in the photoresist layer can include the pattern of etchant access holes to be subsequently formed through the thinned matrix material layer 10T.

An anisotropic etch process may be performed to transfer the pattern of the opening in the photoresist layer through the thinned matrix material layer 10T. The thinned matrix material layer 10T may be divided into multiple portions, which include movable elements (10a, 10b) and a matrix layer 10 that laterally surrounds each of the movable elements (10a, 10b). Generally, the movable elements (10a, 10b) may include any element that is capable of bending, vibrating, deforming, displacement, rotating, twisting, and any other type of change in shape, position, and/or orientation. In an illustrative example, the moving elements (10a, 10b) may include a first movable element 10a for use in an accelerometer and a second movable element 10b for use in a gyroscope. Additional movable elements (not shown) may be patterned out of the thinned matrix material layer 10T. A continuous remaining portion of the thinned matrix material layer 10T that laterally surrounds each of the movable elements (10a, 10b) constitutes a stationary portion of MEMS devices against which relative movement of the movable elements (10a, 10b) may be measured. The stationary remaining portion of the MEMS devices is herein referred to as a matrix layer 10. The movable elements (10a, 10b) and the matrix layer 10 may include a same material. In one embodiment, the movable elements (10a, 10b) and the matrix layer 10 may include a same semiconductor material, which is herein referred to as the first semiconductor material. A subset and/or portions of the movable elements (10a, 10b) may be doped with p-type dopants and/or n-type dopants as needed. Gaps 19 extending down to the first dielectric material layer 10 may formed between the matrix layer 10 and the various movable elements (10a, 10b).

Referring to FIG. 1I, the movable elements (10a, 10b) may be detached from the first dielectric material layer 20 by removing portions of the first dielectric material layer 20 that are connected to the ambient through the gaps 19 extend vertically between the matrix layer 10 and the various movable elements (10a, 10b). An isotropic etchant that etches the material of the first dielectric material layer 20 selective to the material of the matrix layer 10, the movable elements (10a, 10b), the matrix-side bonding dielectric layer 62, the first conductive structures 22, and optionally a topmost sub-layer (which may be an etch stop dielectric layer) within the second dielectric material layer 30 may be applied into the gaps 19 to remove portions of the first dielectric material layer 20 that are connected to the gaps 19. For example, the first dielectric material layer 20 may include borosilicate glass, organosilicate glass, a porous low-k dielectric material, or a polymer material that dissolves in an organic solvent, the matrix-side bonding dielectric layer 62 can include densified undoped silicate glass, and the topmost sub-layer of the second dielectric material layer 30 can include silicon nitride or aluminum oxide. Laterally-extending cavities 29 may be formed underneath the movable elements (10a, 10b) to detach the movable elements (10a, 10b) from underlying structures (such as the first conductive structures 22, the second dielectric material layer 20, etc.). A MEMS assembly is provided, which may include the MEMS substrate 50, conductive structures (22, 32) formed over or within dielectric material layers (20, 30, 40) and overlying the MEMS substrate 50, and a combination of the matrix layer 10 and movable elements (10a, 10b) enclosed therein and overlying the dielectric material layers (20, 30, 40). Generally, at least one movable element (10a, 10b) may be laterally confined within the matrix layer 10 over the MEMS substrate 50, and a patterned matrix-side bonding dielectric layer 62 can be located on a top surface of the matrix layer 10.

Figure 2A:
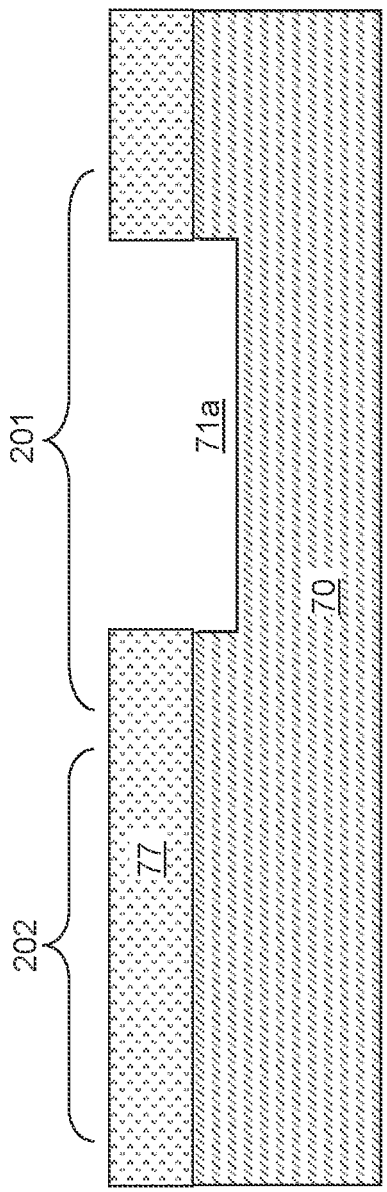
FIG. 2A is a vertical cross-sectional view of a first exemplary structure for forming a cap structure after formation of a first recess region in accordance with an embodiment of the present disclosure.

Referring to FIG. 2A, a first exemplary structure for forming a cap structure is illustrated. The first exemplary structure includes a substrate, which is herein referred to as a cap substrate 70. The cap substrate 70 may include a semiconductor material, an insulating material, and/or a conductive material. In one embodiment, the cap substrate 70 may include a semiconductor material, which is herein referred to as a second semiconductor material. For example, the cap substrate 70 may include a silicon substrate. The thickness of the cap substrate 70 may be in a range from 60 microns to 1 mm, although lesser and greater thicknesses can also be used. In one embodiment, complementary metal-oxide-semiconductor (CMOS) devices such as field effect transistors (not shown) can be provided on the backside of the cap substrate 70.

The cap substrate 70 may have multiple device regions arranged in a mirror image pattern of the pattern of the various device regions (101, 102) of the MEMS assembly illustrated in FIG. 1I. For example, the cap substrate 70 may include a first device region 201, a second device region 202, and optional additional device regions (not illustrated). The first device region 201 of the cap substrate 70 may have a mirror image shape of the first device region 101 of the MEMS assembly of FIG. 1I, and the second device region 202 of the cap substrate 70 can have a mirror image shape of the second device region 102 of the second device region 102 of the MEMS assembly of FIG. 1I.

A photoresist layer 77 may be applied over a top surface of the cap substrate 70. The photoresist layer 77 may be subsequently lithographically patterned to form openings therethrough. One of the openings in the photoresist layer 77 may be formed in a mirror image area of the area of the first movable element 10a in the MEMS assembly of FIG. 1I. An etch process may be performed to recess portions of the top surface of the cap substrate 70 that are not covered by the photoresist layer 77. For example, an anisotropic etch process may be performed to vertically recess portions of the top surface of the cap substrate 70 in areas that are not masked by the photoresist layer 77. A first recess region 71a may be formed within the area of the first device region 201 on the front side of the cap substrate 70. A horizontal recessed surface can be formed underneath the volume of the first recess region 71a. The vertical offset distance (which is the vertical recess distance) between the horizontal recessed surface of the first recess region 71a and the topmost surface of the cap substrate 70 may be in a range from 300 nm to 6 microns, such as from 600 nm to 3 microns, although lesser and greater vertical offset distances can also be used. The photoresist layer 77 can be subsequently removed, for example, by ashing.

Figure 2B:
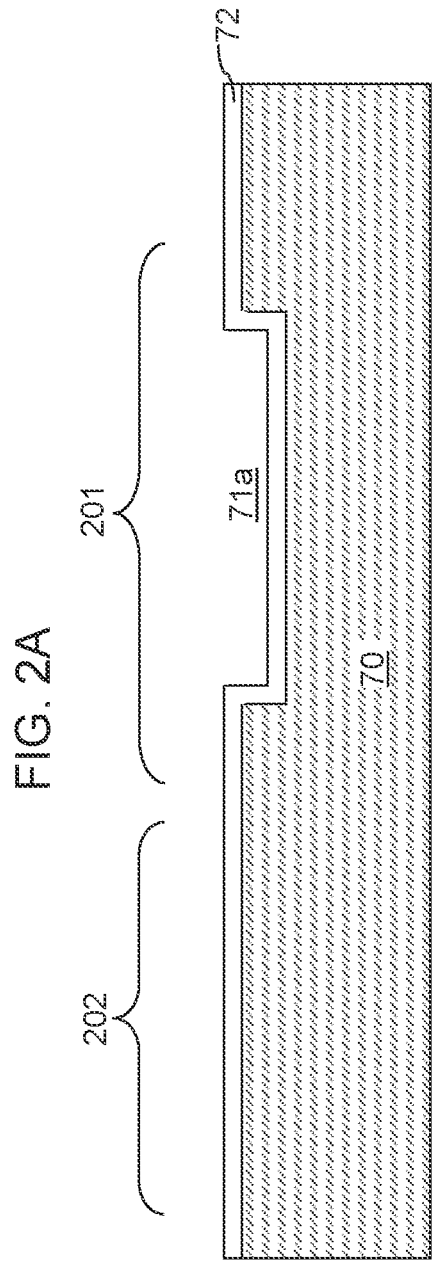
FIG. 2B is a vertical cross-sectional view of the first exemplary structure after formation of a cap-side bonding dielectric layer in accordance with an embodiment of the present disclosure.
Figure 2F:
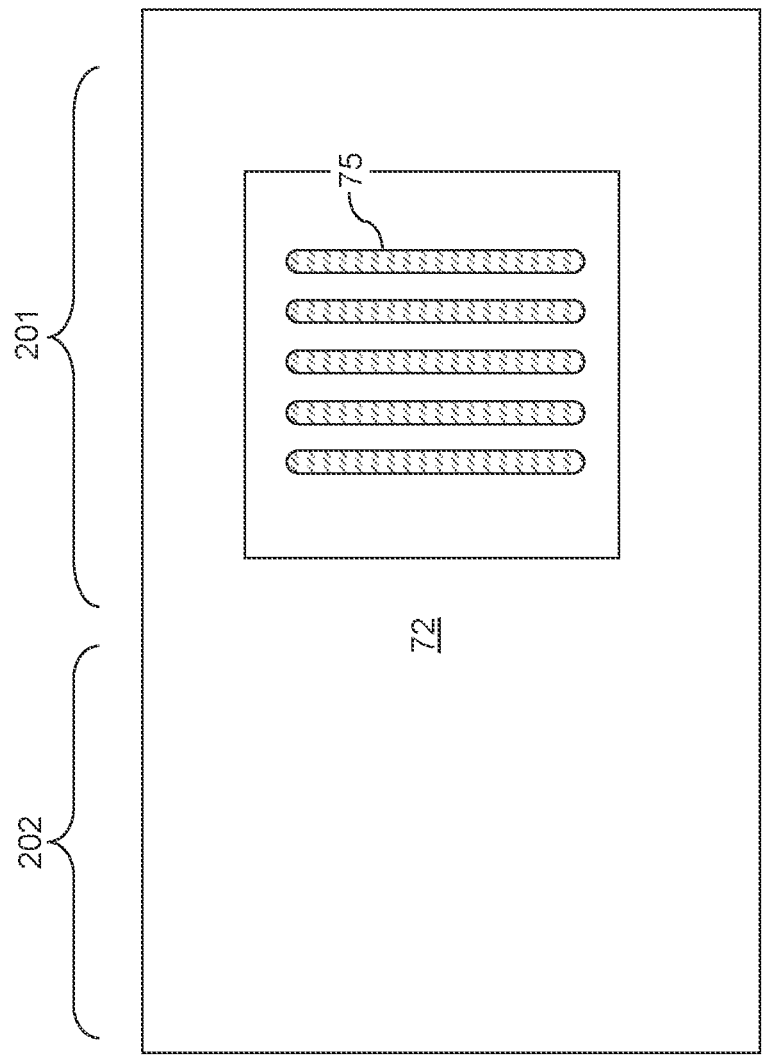
FIG. 2F is a top-down view of a first configuration of the first exemplary structure of FIG. 2D.
Figure 2E:
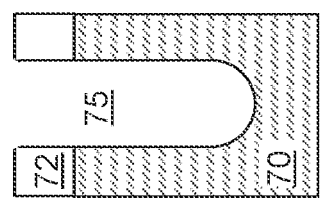
FIG. 2E is a magnified view of the region E in FIG. 2D.
Figure 2G:
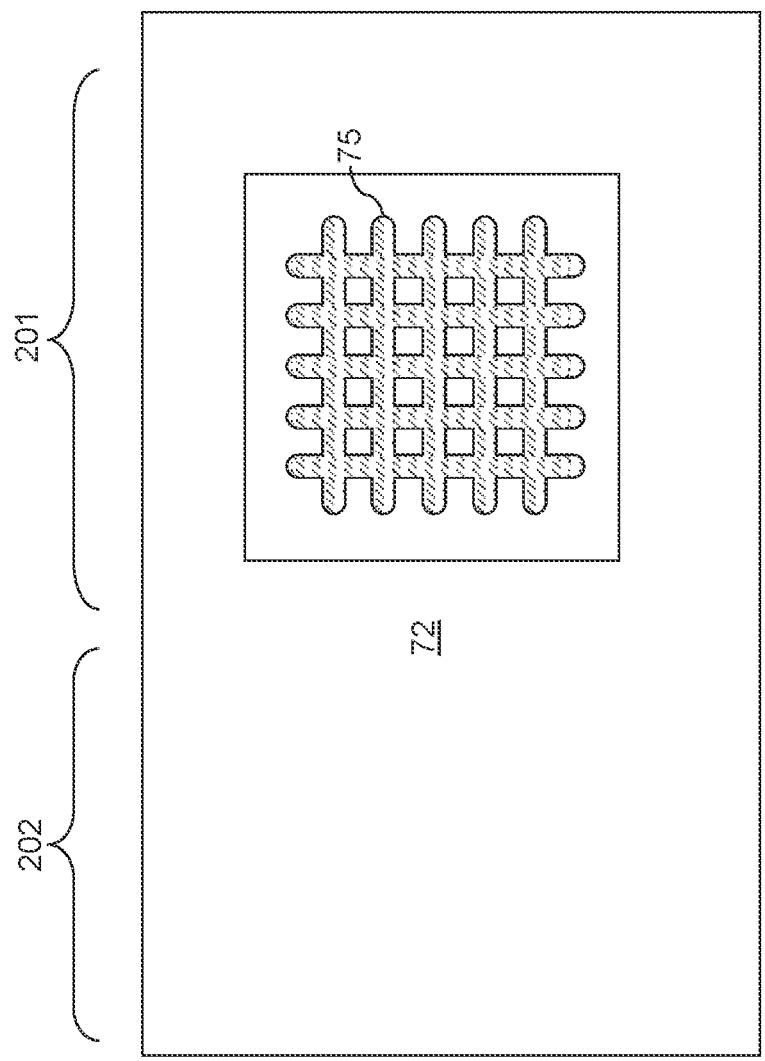
FIG. 2G is a top-down view of a second configuration of the first exemplary structure of FIG. 2D.
Figure 2H:
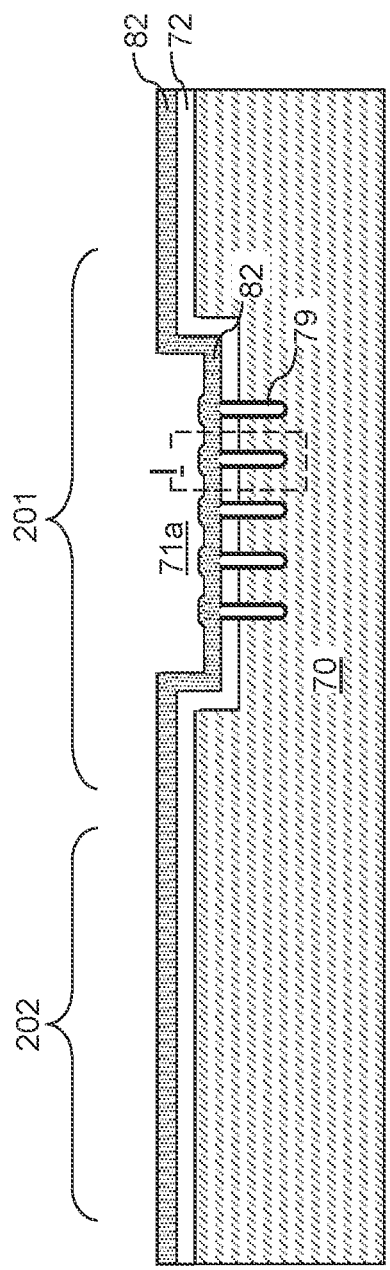
FIG. 2H is a vertical cross-sectional view of the first exemplary structure after formation of a bump-containing material layer in accordance with an embodiment of the present disclosure.
Figure 2J:
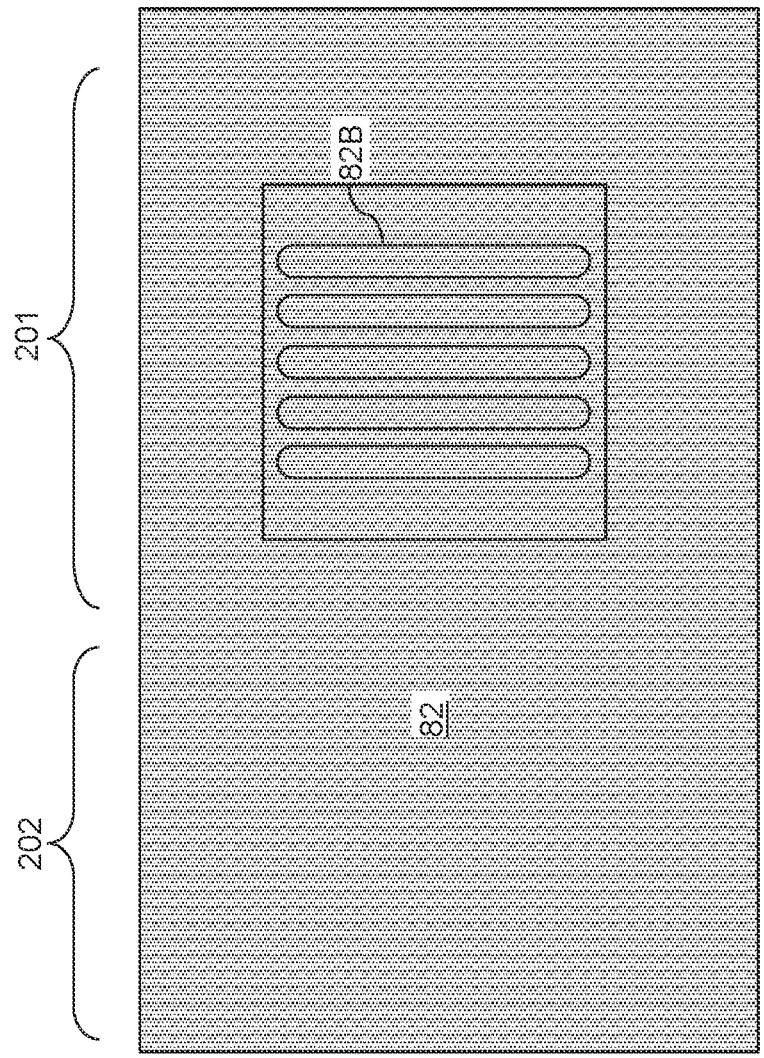
FIG. 2J is a top-down view of the first configuration of the first exemplary structure of FIG. 2H.
Figure 2I:
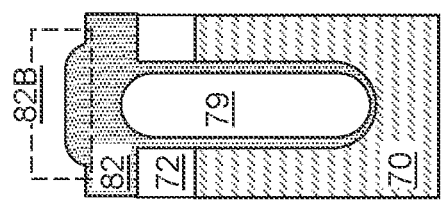
FIG. 2I is a magnified view of the region I in FIG. 2H.
Figure 2K:
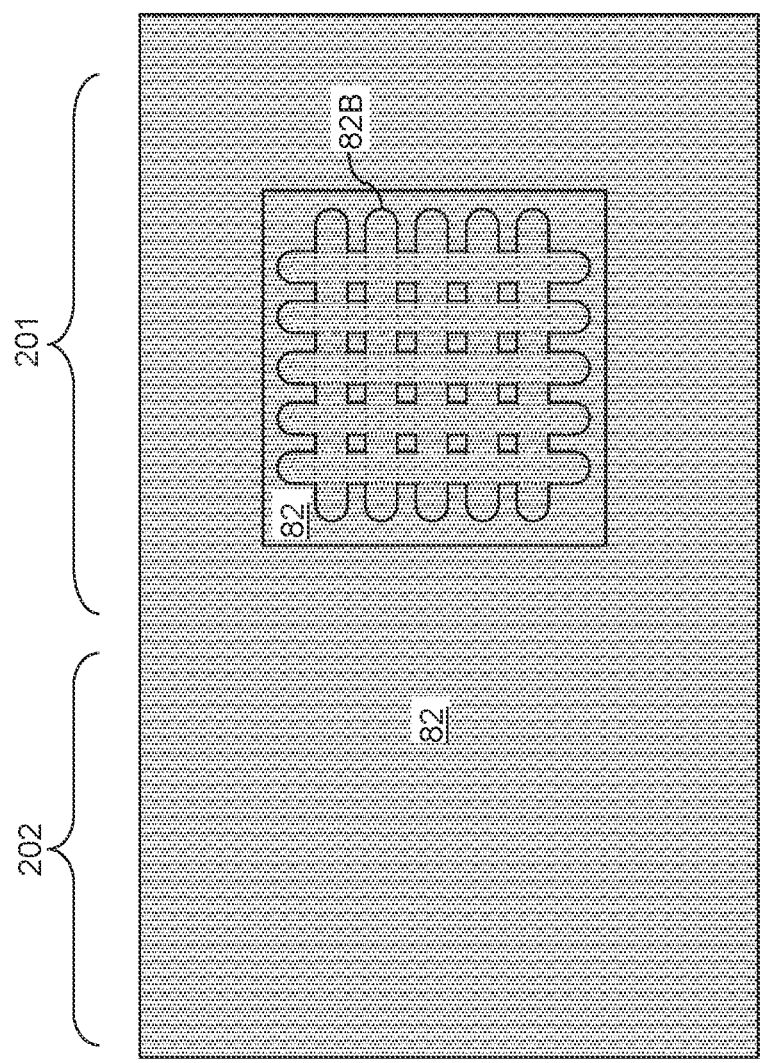
FIG. 2K is a top-down view of the second configuration of the first exemplary structure of FIG. 2H.

Referring to FIG. 2B, a bonding material may be deposited on the top side of the cap substrate 70 to form a bonding dielectric layer, which is herein referred to as a cap-side bonding dielectric layer 72 The bonding material of the cap-side bonding dielectric layer 72 can include silicon oxide, a polymer material, or a dielectric adhesive material. In one embodiment, the cap-side bonding dielectric layer 72 may include the same bonding material as the matrix-side bonding dielectric layer 62. In one embodiment, the cap-side bonding dielectric layer 72 may include silicon oxide and may have a thickness in a range from 100 nm to 1,000 nm, although lesser and greater thicknesses can also be used. The cap-side bonding dielectric layer 72 may be conformally or non-conformally deposited. For example, the cap-side bonding dielectric layer 72 may include undoped silicate glass formed by decomposition of tetraethylorthosilicate. The cap-side bonding dielectric layer 72 may be formed over the topmost (unrecessed) surface and the recessed surface of the cap substrate 70.

Referring to FIG. 2C, a photoresist layer 78 may be applied over the cap-side bonding dielectric layer 72, and may be lithographically patterned to form an array of openings 73 therethrough. In varying embodiments, the array of openings 73 in the photoresist layer 78 may have a periodic line and space pattern, two periodic line and space patterns that intersect each other to form cross-points, or as a two-dimensional periodic array of discrete openings. If two periodic line and space patterns intersect each other, the lengthwise directions line patterns may be perpendicular to each other between a first periodic line and space pattern and a second periodic line and space pattern. The width of each opening may be in a range from 30 nm to 600 nm, and the width of each space may be in a range from 30 nm to 1,200 nm, although lesser and greater dimensions can also be used. An etch process, such as a first anisotropic etch process, can be performed to transfer the pattern in the photoresist layer 78 through the cap-side bonding dielectric layer 72.

Referring to FIGS. 2D, 2E, 2F, and 2G, the pattern of the openings 73 in the cap-side bonding dielectric layer may can be transferred into an underlying portion of the cap substrate 70 by a second anisotropic etch process. The second anisotropic etch process may use the photoresist layer 78 as an etch mask layer. In one embodiment, the photoresist layer 78 may be consumed during the second anisotropic etch process, and the cap-side bonding dielectric layer 72 may be used as an etch mask layer. In another embodiment, the photoresist layer 78 may be removed, for example, by ashing, and the cap-side bonding dielectric layer 72 may be used as an etch mask layer. An array of trenches 75 may be formed underneath the array of openings through the cap-side bonding dielectric layer 72. The trenches 75 may be formed underneath the openings through the cap-side bonding dielectric layer 72, and replicates the pattern of the openings in the cap-side bonding dielectric layer 72. The depth of the trenches 75, as measured between the top surface of the cap-side bonding dielectric layer 72 in the first recess region 71a and the bottommost surfaces of the trenches 75, may be in a range from 200 nm to 4,000 nm. The depth of the trenches 75 can be optimized to balance the manufacturing cost and the degassing capacity. For example, if the depth of the trenches 75 exceeds 4,000 nm, the duration of the anisotropic etch process may be significantly prolonged and the processing cost of the anisotropic etch step may become uneconomically high. If the depth of the trenches 75 is less than 200 nm, the volume of an outgassing material that can be provided in the trenches 75 may be insufficient to provide enough outgassing, and the pressure inside a cavity may be unacceptably low even after outgassing.

The trenches 75 may extend through the cap-side bonding dielectric layer 72 into the cap substrate 70 within the first recess region 71a. The trenches 75 can be formed as a one-dimensional array illustrated in FIG. 2F, or as a two-dimensional array illustrated in FIG. 2G. A unit pattern (such as a pattern of a single trench 75) is repeated in one direction in a one-dimensional array, and a unit pattern (such as a pattern of a cross-point at which two perpendicular trenches 75 intersect) is repeated in two directions in a two-dimensional array.

Referring to FIGS. 2H, 2I, 2J, and 2K, a bump-containing material layer 82 may be deposited by a non-conformal deposition process. The bump-containing material layer 82 includes an array of bumps as will be described below. The bump-containing material layer 82 can include a buffer material, which includes at least one of a semiconductor material and an outgas sing dielectric material. The buffer material may consist of a semiconductor material, may consist of an outgassing dielectric material, or may include a combination of a semiconductor material and an outgassing dielectric material. In one embodiment, the bump-containing material layer 82 may include, and/or consist essentially of, amorphous silicon, which can be undoped amorphous silicon or doped amorphous silicon. Alternatively, or additionally, the bump-containing material layer 82 may include, and/or consist essentially of, an outgassing dielectric material. The outgassing dielectric material can include undoped silicate glass, a doped silicate glass, or combinations thereof. In case the bump-containing material layer 82 includes an outgassing dielectric material, a gas may be trapped in the bump-containing material layer 82 during deposition of the bump-containing material layer 82, and can be subsequently released into a vacuum cavity (such as a first cavity to be subsequently formed to contain the first movable element 10a illustrated in FIG. 1I). In an illustrative example, the bump-containing material layer 82 can include undoped silicate glass formed by plasma decomposition of tetraethylorthosilicate. Alternatively, the bump-containing material layer 82 may include silicon oxynitride or other suitable dielectric outgassing materials. In one embodiment, the bump-containing material layer 82 may be deposited at a temperature not higher than about 500 degrees Celsius. For example, the bump-containing material layer 82 may be deposited in a plasma enhanced chemical vapor deposition (PECVD) process. The deposition temperature may be in a range from about 300 degrees Celsius to about 500 degrees Celsius, and silane, disilane, tetraethylorthosilicate, or other suitable precursor gases for the buffer material can be decomposed under a plasma environment. The thickness of the bump-containing material layer 82 on a flat horizontal surface can be in a range from 30 nm to 600 nm, such as from 60 nm to 300 nm. Generally, the thickness of the bump-containing material layer 82 can be greater than one half of the width of trenches 75, and is selected to preserve a topographical variation (bumps) caused by the formation of seals over the trenches 75. In this case, the thickness of the bump-containing material layer 82 can be less than the width of the trenches 75. In case the trenches 75 has a width in a range from 60 nm to 600 nm, the thickness of the bump-containing material layer 82 can be greater than one half of the width of the trenches 75 (such as greater than 30 nm), and can be less than four times the width of the trenches 75 (such as less than 600 nm).

The bump-containing material layer 82 may be formed over the cap-side bonding dielectric layer 72. The non-conformal nature of the deposition process that forms the bump-containing material layer 82 induces formation of voids 79 within the trenches 75. Specifically, the non-conformal deposition process may deposit the buffer material of the bump-containing material layer 82 on sidewalls of the trenches 75 such that sidewalls of the trenches 75 are lined with the buffer material. As the buffer material of the bump-containing material layer 82 accumulates at upper peripheries of the trenches 75 at a higher deposition rate than at the bottom of the trenches 75 during the non-conformal deposition process, pinch-off occurs at the top of each trench 75. Thus, the non-conformal deposition process forms the voids 79 in the volumes of the trenches 75 that are not filled within the buffer material.

Further, the pinching-off of the deposited buffer material at top portions of the trenches 75 causes local raising of the top surface of the bump-containing material layer 82, thereby forming hillocks or bumps. Thus, portions of the bump-containing material layer 82 that overlie the trenches 75 form an array of upward-protruding bumps 82B. Generally, the bump-containing material layer 82 can be formed by a non-conformal deposition process that forms each of the upward-protruding bumps 82B with a vertical cross-sectional profile of a hillock. Each of the upward-protruding bumps 82B overlies a respective one of the voids 79. The vertical distance between the topmost surfaces of the upward-protruding bumps 82B and the horizontal plane including the interface between the cap-side bonding dielectric layer 72 and the horizontally-extending portion of the bump-containing material layer 82 can be in a range 105% to 150% of the thickness of the horizontally-extending portion of the bump-containing material layer 82, such as from 31.5 nm to 900 nm.

In one embodiment, the upward-protruding bumps 82B can have a vertical cross-sectional profile of a hillock. The first device region 201 of the cap substrate 70 may have a vertically recessed horizontal surface that is vertically offset upward from a topmost horizontal surface of the cap substrate 70. The trenches 75 vertically extend downward into the cap substrate 70 from the vertically recessed horizontal surface of the cap substrate 70, and underlie a respective one of the upward-protruding bumps 82B. The voids 79 within the trenches 75 may be free of any solid phase material or any liquid phase material. The voids 79 may be contained within sidewalls of the trenches 75 and may underlie a respective upward-protruding bump 82B. Surfaces of the trenches 75 may be lined with the buffer material of the bump-containing material layer 82. Each of the voids 79 comprises an encapsulated cavity defined by a respective continuous surface of the buffer material of the bump-containing material layer 82 without any hole therethrough.

Referring to FIG. 2L, the top horizontal portion of the bump-containing material layer 82 may be removed from above the horizontal top surface of the cap-side bonding dielectric layer 72. For example, a chemical mechanical planarization process may be performed to remove the horizontal portions of the bump-containing material layer 82 that overlies the cap-side bonding dielectric layer 72. A remaining portion of the bump-containing material layer 82 may be laterally confined within the periphery of the first recess region 71a.

Referring to FIG. 2M, a first etch mask layer 92 can be formed over the bump-containing material layer 82 and the cap-side bonding dielectric layer 72. The first etch mask layer 92 may include a hard mask material such as silicon nitride or a dielectric metal oxide. The first etch mask layer 92 may be patterned to form an opening within the second device region 202. An etch process, such as an isotropic etch process or an anisotropic etch process, may be performed to etch through the physically exposed portion of the cap-side bonding dielectric layer 72 that underlies the opening in the first etch mask layer 92. Thus, an opening 91 may be formed through the cap-side bonding dielectric layer 72 in the second device region 92.

Figure 2N:
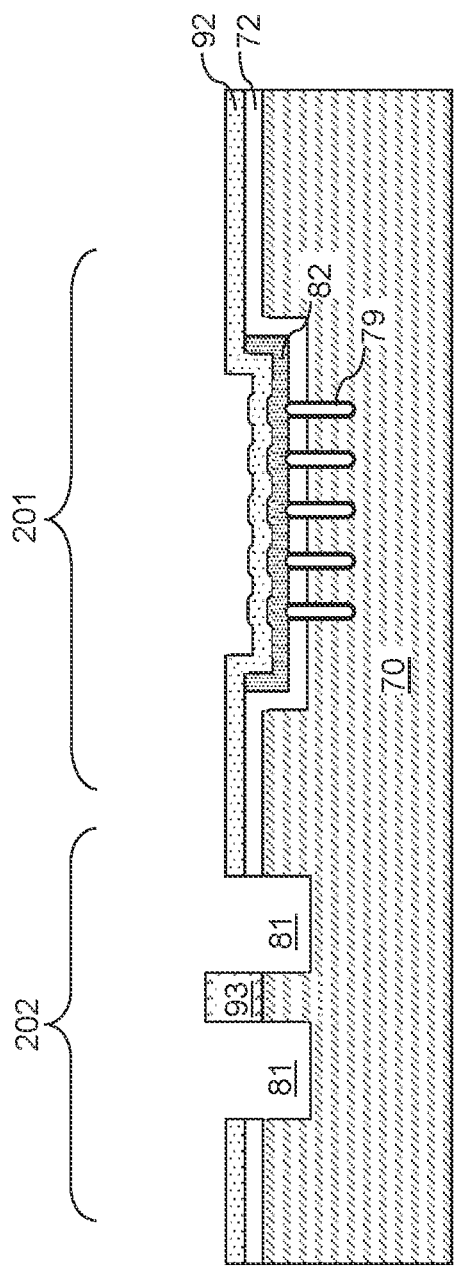
FIG. 2N is a vertical cross-sectional view of the first exemplary structure after formation of a second etch mask layer and vertically recessing a portion of the cap substrate in accordance with an embodiment of the present disclosure.

Referring to FIG. 2N, a second etch mask layer 93 may be formed to cover a fraction of the area of the opening 91 through the cap-side bonding dielectric layer 72. The second etch mask layer 93 may be a patterned hard mask layer, or may be a patterned soft mask layer (such as a patterned photoresist layer). In one embodiment, the second etch mask layer 93 may cover a center region of the opening in the cap-side bonding dielectric layer 72 in the second device region 202. Unmasked portions of the cap substrate 70 that are not covered by the first etch mask layer 92 or by the second etch mask layer 93 may be vertically recessed by an anisotropic etch process to form a recess region, which is herein referred to as an in-process recess region 81. An "in-process" element refers to an element that is subsequently modified. The second etch mask layer 93 can be subsequently removed selective to the first etch mask layer 92.

Figure 2O:
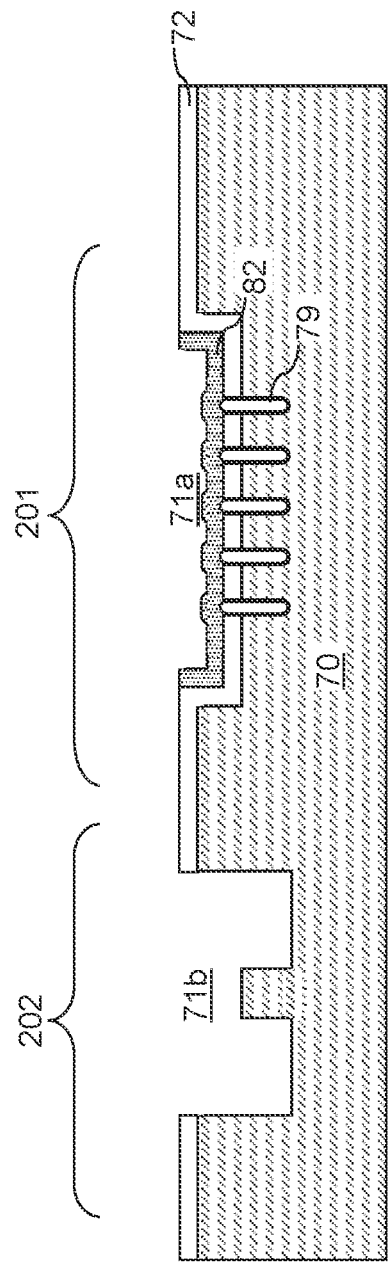
FIG. 2O is a vertical cross-sectional view of the first exemplary structure after formation of a second recess region in accordance with an embodiment of the present disclosure.

Referring to FIG. 2O, an anisotropic etch process may be performed to vertically recess portions of the cap substrate 70 that are not masked by the first etch mask layer 92. A second recess region 71b can be formed within the area of the opening 91 through the cap-side bonding dielectric layer 72. The first etch mask layer 92 can be subsequently removed selective to the cap-side bonding dielectric layer 72 and the bump-containing material layer 82.

The second recess region 71b, if provided, is an additional recess region that may be formed adjacent to the first recess region 71a. The second recess region 71b comprises an additional upward-protruding bump that protrudes upward from a recessed surface of the second recess region 71b. The recess surface of the second recess region 71b may be located within the area of the in-process recess region 81, and the additional upward-protruding bump may be laterally surrounded by the area of the recessed surface of the second recess region 71b. In one embodiment, a top surface of the additional upward-protruding bump comprises a planar horizontal surface of the cap substrate 70 that is vertically recessed from a topmost surface of the cap substrate 70. The recess depth of the top surface of the additional upward-protruding bump can be the vertical etch distance of the anisotropic etch process at the processing steps of FIG. 2O. Upon formation of a chamber after bonding with the MEMS assembly of FIG. 1I, the top surface of the additional upward-protruding bump can function as a capping surface that stops vertical movement of a movable element such as the second movable element 10b illustrated in FIG. 1I. The cap-side bonding dielectric layer 72 may extend over the topmost surface of the cap substrate 72.

Figure 3:
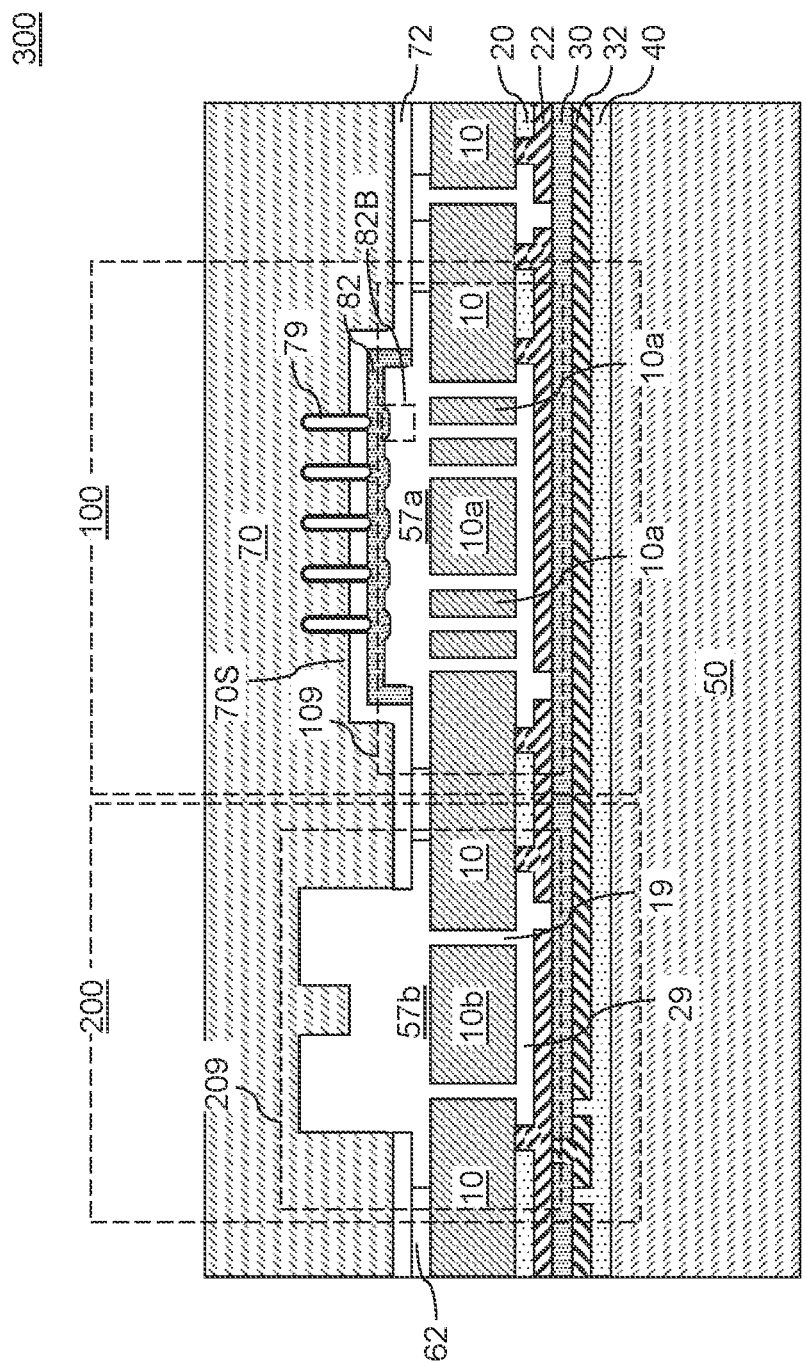
FIG. 3 is a first exemplary micro-electro mechanical system (MEMS) device in accordance with an embodiment of the present disclosure.

Referring to FIG. 3, the first exemplary structure of FIG. 2O may be bonded to the MEMS assembly of FIG. 1I to form a first exemplary micro-electro mechanical system (MEMS) device 300. In this illustrated embodiment, the cap substrate 70 may be bonded to the matrix layer 10 such that the front side (i.e., the upside as illustrated in FIG. 2O) of the cap substrate 70 faces the matrix layer 10 (effectively flipping the cap substrate 70 illustrated in FIG. 2O upside down). In one embodiment, the bonding of the cap substrate 70 to the matrix layer 10 may be achieved by bonding the matrix-side bonding dielectric layer 62 to the cap-side bonding dielectric layer 72. The matrix-side bonding dielectric layer 62 may be located on the top surface of the matrix layer 10. The cap-side bonding dielectric layer 72 extends beneath a bottom surface of the cap substrate 70, and may be bonded to the matrix-side bonding dielectric layer 62.

A first chamber 109 including a first movable element 10a may be formed by the matrix layer 10 and the cap substrate 70. The first chamber 109 includes a first head volume 57a that overlies the first movable element 10a. A surface of the array of upward-protruding bumps 82B as formed at the processing steps of FIGS. 2H-2K provides a first capping surface over the first movable element 10a within the first chamber 109. Because the cap substrate 70 is upside down at the processing steps of FIG. 3, the array of upward-protruding bumps 82B as formed at the processing steps of FIGS. 2H-2K becomes an array of downward-protruding bumps within the first exemplary MEMS device 300 of FIG. 3. The first chamber 109 may be laterally bounded by the matrix layer 10 and may be vertically bounded by the first capping surface that overlies the first movable element 10a. The first capping surface comprises an array of downward-protruding bumps 82B including respective portions of the bump-containing material layer 82. The vertically recessed horizontal surface within the first device region 201 becomes a vertically raised horizontal surface 70S. The upward-protruding bumps 82B become downward-protruding bumps 82B. The trenches 75 become inverted trenches 75. A first MEMS device 100 includes the first movable element 10a, the first chamber 109, and the first capping surface. The first MEMS device 100 may form an accelerometer.

A second chamber 209 including a second movable element 10b may be formed by aligning the second recess region 202 of the cap substrate 70 over the second movable element 10b during bonding the cap substrate 70 to the matrix layer 10. The second chamber 209 may include a second head volume 57b that overlies the second movable element 10b. The second chamber 209 may be vertically bounded by a second capping surface that overlies the second movable element 10b. The second capping surface can comprise the planar horizontal surface of the cap substrate 70 located within the second recess region 71b. The second chamber 209 may be vertically bounded by the second capping surface that overlies the second movable element 10b. A second MEMS device 200 includes the second movable element 10b, the second chamber 209, and the second capping surface. The MEMS device of the present disclosure can be a composite MEMS device including the first MEMS device 100 (which can include an accelerometer) and the second MEMS device 200 (which can include a gyroscope).

Referring to FIG. 4A, a second exemplary structure for forming a cap structure includes a cap substrate 70, which can be the same as the cap substrate 70 of FIG. 2A. A patterned hard mask layer 182 can be formed on the top surface of the cap substrate 70. The patterned hard mask layer 182 may be formed by depositing a hard mask material such as silicon oxide, silicon nitride, and/or a dielectric metal oxide, and by patterning the deposited hard mask material. The deposited hard mask material may be patterned, for example, by applying and patting a photoresist layer and by transferring the pattern in the photoresist layer (not shown) through the deposited hard mask material using an etch process that etches the deposited hard mask material selective to the material of the cap substrate 70. For example, an anisotropic etch process may be performed to transfer the pattern in the photoresist layer through the deposited hard mask material. The photoresist layer may be subsequently removed, for example, by ashing.

The openings in the patterned hard mask layer 182 may include a first opening formed in a first device region 201 and a second opening formed in a second device region 202. The first device region 201 of the cap substrate 70 may have a mirror image shape of the first device region 101 of the MEMS assembly of FIG. 1I, and the second device region 202 of the cap substrate 70 may have a mirror image shape of the second device region 102 of the second device region 102 of the MEMS assembly of FIG. 1I.

Referring to FIG. 4B, a patterned etch mask layer 95 may be formed over the patterned hard mask layer 182 and over the front side of the cap substrate 70. The patterned etch mask layer 95 may be a patterned soft mask layer (such as a patterned photoresist layer). In one embodiment, the patterned etch mask layer 95 may include an array of openings 73 in the first device region 201 and an opening within the area of the opening in the patterned hard mask layer 182 in the second device region 202. In various embodiments, the array of openings 73 in the patterned etch mask layer 95 within the first device region 201 may have a periodic line and space pattern, two periodic line and space patterns that intersect each other to form cross-points, or a two-dimensional periodic array of discrete openings. If two periodic line and space patterns intersect each other, the lengthwise directions line patterns may be perpendicular to each other between a first periodic line and space pattern and a second periodic line and space pattern. The width of each opening 73 may be in a range from 30 nm to 600 nm, and the width of each space may be in a range from 30 nm to 1,200 nm, although lesser and greater dimensions can also be used. The patterned hard mask layer 95 can cover a center region of the opening in the patterned hard mask layer 182 in the second device region 202.

Referring to FIG. 4C, in an embodiment, a first anisotropic etch process may be performed to etch portions of the cap substrate 70 that are not masked by the combination of the patterned etch mask layer 95 and the patterned hard mask layer 182. An array of first trenches 75a may be formed underneath the array of openings in the patterned etch mask layer 95. The depth of the first trenches 75a, as measured between the top surface of the cap substrate 70 and the bottommost surfaces of the first trenches 75a, may be in a range from 200 nm to 4,000 nm, although lesser and greater depths may also be used. The depth of the first trenches 75a can be optimized to balance the manufacturing cost and the degassing capacity. For example, if the depth of the first trenches 75a exceeds 4,000 nm, the duration of the anisotropic etch process may be significantly prolonged and the processing cost of the anisotropic etch step may become uneconomically high. If the depth of the first trenches 75a is less than 200 nm, the volume of an outgas sing material that can be provided in the first trenches 75a may be insufficient to provide enough outgassing, and the pressure inside a cavity may be unacceptably low even after outgassing. The first trenches 75a may be formed as a one-dimensional array, or as a two-dimensional array. A unit pattern (such as a pattern of a single first trench) may be repeated in one direction in embodiment that implement a one-dimensional array, and a unit pattern (such as a pattern of a cross-point at which two perpendicular first trenches intersect) is repeated in two directions in embodiments that implement a two-dimensional array.

Unmasked portions of the cap substrate 70 that are not covered by the combination of the patterned etch mask layer 95 and the patterned hard mask layer 182 in the second device region 202 may be vertically recessed by the first anisotropic etch process to form a recess region, which is herein referred to as an in-process recess region 81. The patterned etch mask layer 95 may be subsequently removed selective to the patterned hard mask layer 182.

Referring to FIG. 4D, a second anisotropic etch process can be performed using the patterned hard mask layer 182 as an etch mask. A region of the cap substrate 70 that include the first trenches 75a may be anisotropically etched and vertically recessed by the second anisotropic etch process to form a first recess region 71a. The first trenches 75a may be further etched during the second anisotropic etch process to form second trenches 75b that extend downward from the recessed horizontal surface of the first recess region 71a. The second trenches 75b replicate the pattern of the first trenches 75a, and vertically extend downward from the recessed horizontal surface in the first device region 201. The depth of the second trenches 75b may be in a range from 200 nm to 4,000 nm, although lesser and greater depths may also be used.

The second anisotropic etch process vertically recesses a portion of the cap substrate 70 in the second device region 202 that is not masked by the patterned hard mask layer 182. A second recess region 71b may be formed within the area of an opening through the patterned hard mask layer 182 that overlies the in-process recess region 81. The second recess region 71b, if provided, is an additional recess region that is formed adjacent to the first recess region 71a. The second recess region 71b comprises an upward-protruding bump that protrudes upward from a recessed surface of the second recess region 71b. The upward-protruding bump may be laterally surrounded by the area of the recessed surface of the second recess region 71b. The recess depth of the top surface of the upward-protruding bump may be the vertical etch distance of the second anisotropic etch process. The patterned hard mask layer 182 may be subsequently removed selective to the cap substrate 70, for example, by a wet etch process.

Referring to FIGS. 4E, 4F, 4G, and 4H, a bump-containing material layer 192 may be deposited by a non-conformal deposition process. The bump-containing material layer 192 includes a bonding material, which may include silicon oxide, a polymer material, or a dielectric adhesive material. In one embodiment, the bump-containing material layer 192 may include the same bonding material as the matrix-side bonding dielectric layer 62. In one embodiment, the bump-containing material layer 192 may include silicon oxide and has a vertical thickness in a range from 30 nm to 300 nm, such as from 60 nm to 150 nm, although lesser and greater thicknesses can also be used. For example, the bump-containing material layer 192 may include undoped silicate glass formed by decomposition of tetraethylorthosilicate in a plasma-enhanced chemical vapor deposition (PECVD) process, which is a non-conformal deposition process. The bump-containing material layer 192 may be formed all physically exposed surfaces of the cap substrate 70 located on the front side of the cap substrate 70.

The non-conformal nature of the deposition process that forms the bump-containing material layer 192 may induce the formation of voids 79 within the second trenches 75b. Specifically, the non-conformal deposition process may deposit the dielectric material of the bump-containing material layer 192 on sidewalls of the second trenches 75b such that sidewalls of the second trenches 75b are lined with the dielectric material. As the dielectric material of the bump-containing material layer 192 accumulates at upper peripheries of the second trenches 75b at a higher deposition rate than at the bottom of the second trenches 75b during the non-conformal deposition process, pinch-off occurs at the top of each second trench 75b. Thus, the non-conformal deposition process forms the voids 79 in the volumes of the second trenches 75b that are not filled within the dielectric material.

Further, the pinching-off of the deposited dielectric material at top portions of the second trenches 75b causes local raising of the top surface of the bump-containing material layer 192, thereby forming hillocks or bumps. Thus, portions of the bump-containing material layer 192 that overlie the second trenches 75b form an array of upward-protruding bumps 192B. Generally, the bump-containing material layer 192 can be formed by a non-conformal deposition process that forms each of the upward-protruding bumps 192B with a vertical cross-sectional profile of a hillock. Each of the upward-protruding bumps 192B overlies a respective one of the voids 79.

In one embodiment, the upward-protruding bumps 192B may have a vertical cross-sectional profile of a hillock. The first device region 201 of the cap substrate 70 may have a vertically recessed horizontal surface that is vertically offset upward from a topmost horizontal surface of the cap substrate 70. The trenches 75 vertically extend downward into the cap substrate 70 from the vertically recessed horizontal surface of the cap substrate 70, and underlie a respective one of the upward-protruding bumps 192B. The voids 79 within the second trenches 75b may be free of any solid phase material or any liquid phase material. The voids 79 may be contained within sidewalls of the second trenches 75b and may underlie a respective upward-protruding bump 192B. Surfaces of the second trenches 75b may be lined with the dielectric material of the bump-containing material layer 192. Each of the voids 79 comprises an encapsulated cavity defined by a respective continuous surface of the dielectric material of the bump-containing material layer 192 without any hole therethrough.

Figure 4E:
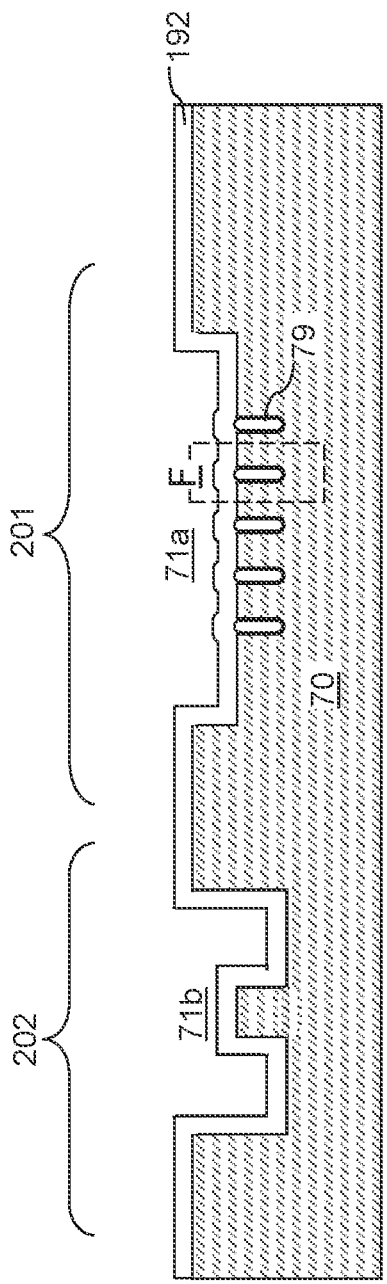
FIG. 4E is a vertical cross-sectional view of the second exemplary structure after formation of a bump-containing material layer in accordance with an embodiment of the present disclosure.
Figure 4H:
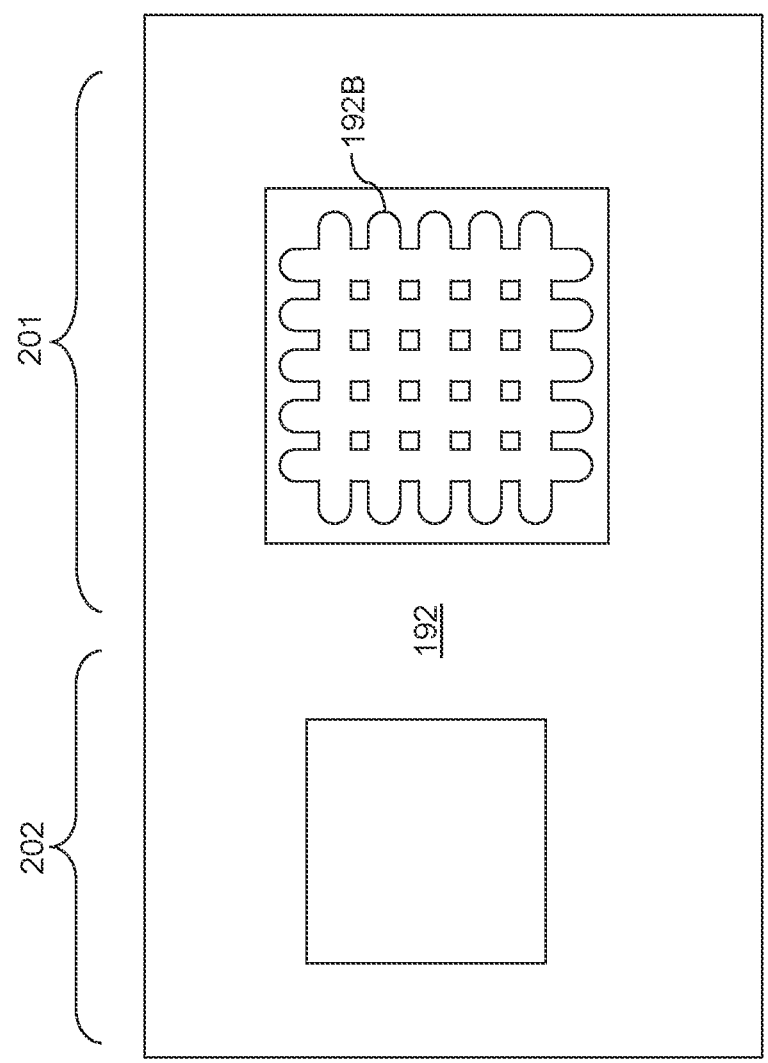
FIG. 4H is a top-down view of the second configuration of the second exemplary structure of FIG. 4E.
Figure 5:
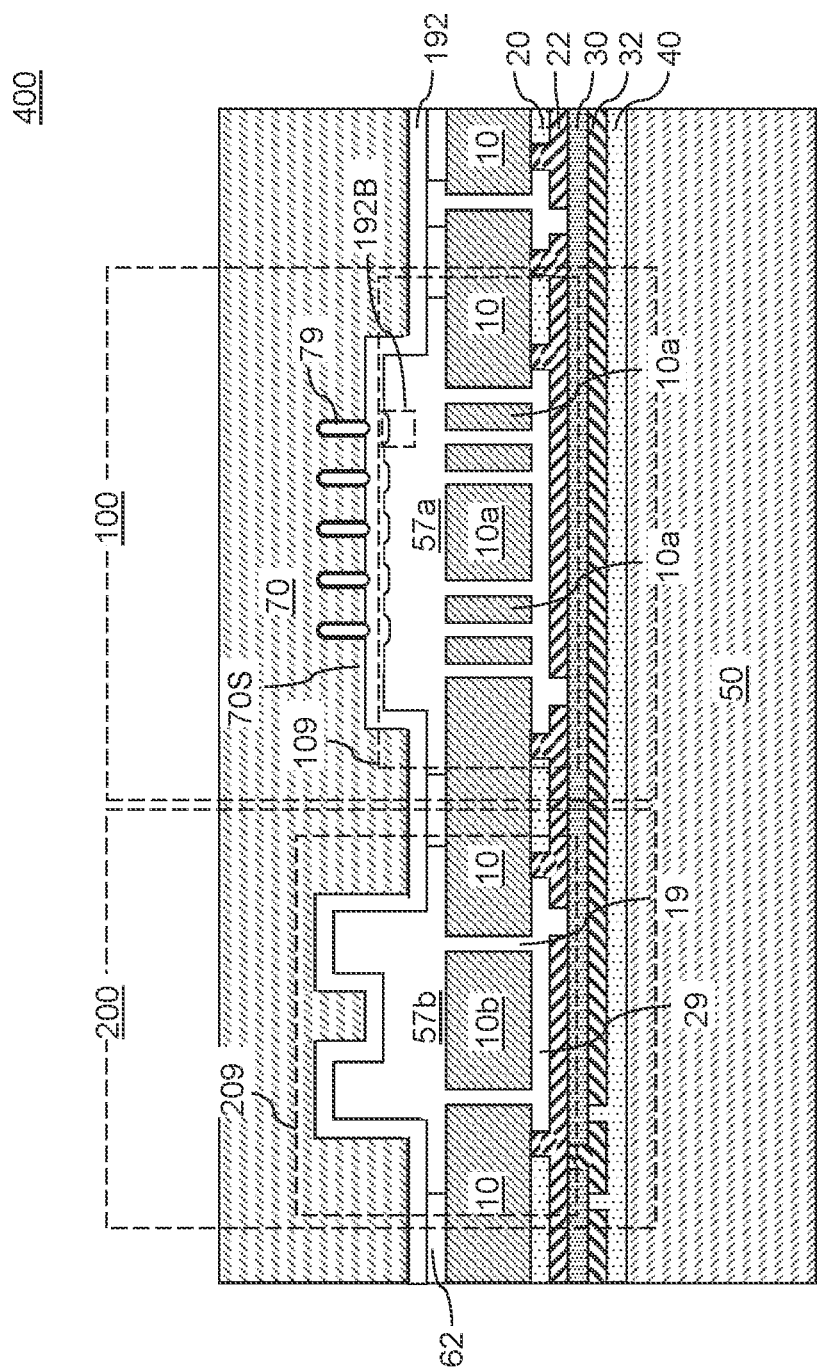
FIG. 5 is a second exemplary micro-electro mechanical system (MEMS) device in accordance with an embodiment of the present disclosure.

Referring to FIG. 5, the second exemplary structure of FIGS. 4E-4H can be bonded to the MEMS assembly of FIG. 1I to form a second exemplary micro-electro mechanical system (MEMS) device 400. In this case, the cap substrate 70 may be bonded to the matrix layer 10 such that the front side (i.e., the upside as illustrated in FIG. 4E) of the cap substrate 70 faces the matrix layer 10. In one embodiment, the bonding of the cap substrate 70 to the matrix layer 10 may be achieved by bonding the matrix-side bonding dielectric layer 62 to the bump-containing material layer 192. The matrix-side bonding dielectric layer 62 may be located on the top surface of the matrix layer 10. The bump-containing material layer 192 extends beneath a bottom surface of the cap substrate 70, and may be bonded to the matrix-side bonding dielectric layer 62.

A first chamber 109 including a first movable element 10a may be formed by the matrix layer 10 and the cap substrate 70. The first chamber 109 includes a first head volume 57a that overlies the first movable element 10a. A surface of the array of upward-protruding bumps 82B as formed at the processing steps of FIGS. 4E-4H provides a first capping surface over the first movable element 10a within the first chamber 109. Because the cap substrate 70 is upside down at the processing steps of FIG. 5, the array of upward-protruding bumps 192B as formed at the processing steps of FIGS. 4E-4H becomes an array of downward-protruding bumps within the second exemplary MEMS device 400 of FIG. 5. The first chamber 109 may be laterally bounded by the matrix layer 10 and may be vertically bounded by the first capping surface that overlies the first movable element 10a. The first capping surface comprises an array of downward-protruding bumps 192B including respective portions of a dielectric material layer, which can be the bump-containing material layer 192. The vertically recessed horizontal surface within the first device region 201 becomes a vertically raised horizontal surface 70S. The upward-protruding bumps 192B become downward-protruding bumps 192B. The second trenches 75b become inverted trenches 75b. A first MEMS device 100 includes the first movable element 10a, the first chamber 109, and the first capping surface.

A second chamber 209 including a second movable element 10b can be formed by aligning the second recess region 202 of the cap substrate 70 over the second movable element 10b during bonding the cap substrate 70 to the matrix layer 10. The second chamber 209 includes a second head volume 57b that overlies the second movable element 10b. The second chamber 209 may be vertically bounded by a second capping surface that overlies the second movable element 10b. The second capping surface may comprise a flat (horizontal) bottom surface of the bump-containing material layer 192 located within the second recess region 71b and vertically offset upward from a bottommost surface of the cap substrate 70. The second chamber 209 may be vertically bounded by the second capping surface that overlies the second movable element 10b. A second MEMS device 200 includes the second movable element 10b, the second chamber 209, and the second capping surface. The MEMS device of the present disclosure can be a composite MEMS device 400 including the first MEMS device 100 (which can include an accelerometer) and the second MEMS device 200 (which can include a gyroscope).

Figure 6:
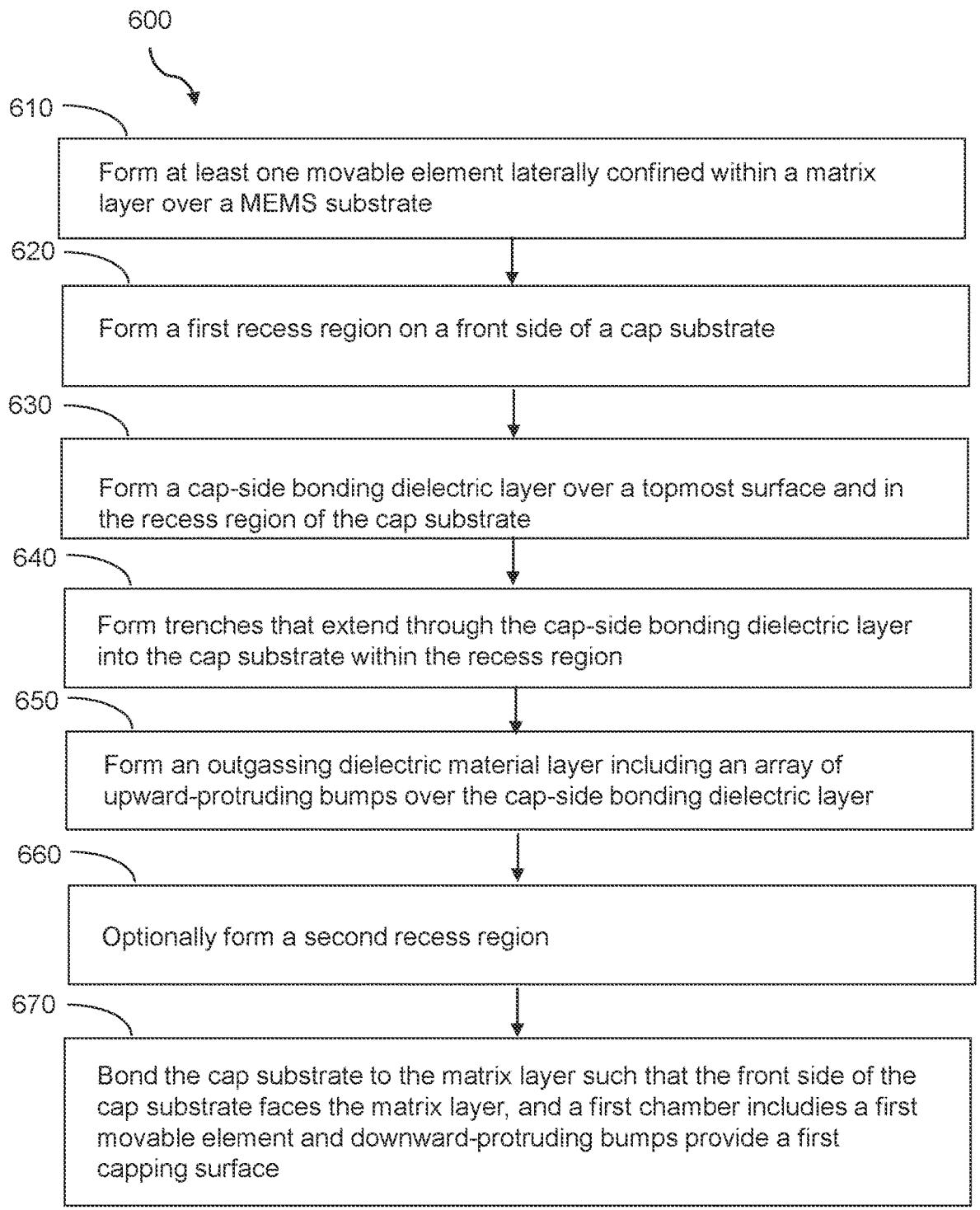
FIG. 6 is a process flow chart illustrating the operation to form a MEMS device assembly in accordance with an embodiment of the present disclosure.

FIG. 6 is a process flow diagram illustrating the operations of a method 600 to form a MEMS device 300. The MEMS device 300 can include a first MEMS device 100 and/or a second MEMS device 200, and may optionally include an additional MEMS device provided on a same MEMS substrate 50. In step 610, at least one movable element (10a, 10b) may be formed within a matrix level 10 that overlies the MEMS substrate 50 in accordance with the process steps illustrated with reference to FIGS. 1A-1I and described in greater detail above. The at least one movable element (10a, 10b) may be formed first and set aside, or formed concurrently with, or subsequent to, a cap structure illustrated in FIGS. 2A-2O. While FIG. 6 illustrates the formation of the cap structure in steps 620-660, one of ordinary skill in the art would recognize that various embodiments may perform the disclosed steps in a variety of sequences. In step 620, a first recess region 71a may be formed on a front side of a cap substrate 70. In step 630, a cap-side bonding dielectric layer 72 may be formed over a topmost surface and in the first recess region 71a of the cap substrate 70. In step 640, trenches 75 that extend through the cap side bonding dielectric layer 72 into the cap substrate 70 may be formed within the area of the first recess region. In step 650, a bump-containing material layer 82 may be formed over the cap side bonding dielectric layer 72. As discussed above with respect to FIGS. 2A-2O, portions of the bump-containing material layer 82 that overlie the trenches 82 can form an array of upward protruding bumps 82B. Further, the bump-containing material layer 82 may be formed by a non-conformal deposition process that forms each of the upward-protruding bumps 82B with a vertical cross-sectional profile of a hillock. In some embodiments, the non-conformal deposition process may deposit a buffer material of the bump-containing material layer 82 on sidewalls of the trenches 75 such that sidewalls of the trenches are lined with the buffer material, and forms voids 79 in volumes of the trenches 75 that are not filled with the buffer material. Each of the upward-protruding bumps 82B overlies a respective one of the voids. In an optional step 660, a second recess region 71b may be formed on a front side of a cap substrate 70.

In step 670, the cap substrate 70 may be bonded to the matrix layer 10 such that the front side of the cap substrate 70 faces the matrix layer 10, and a first chamber 109 including a first movable element 10a (which is one of the at least one movable element (10a, 10b) is formed by the matrix layer 10 and the cap substrate 70, wherein a surface of the array of upward-protruding bumps 82B provides a first capping surface within the first chamber 109 after being placed upside down over the first movable element 10a during bonding.

Figure 7:
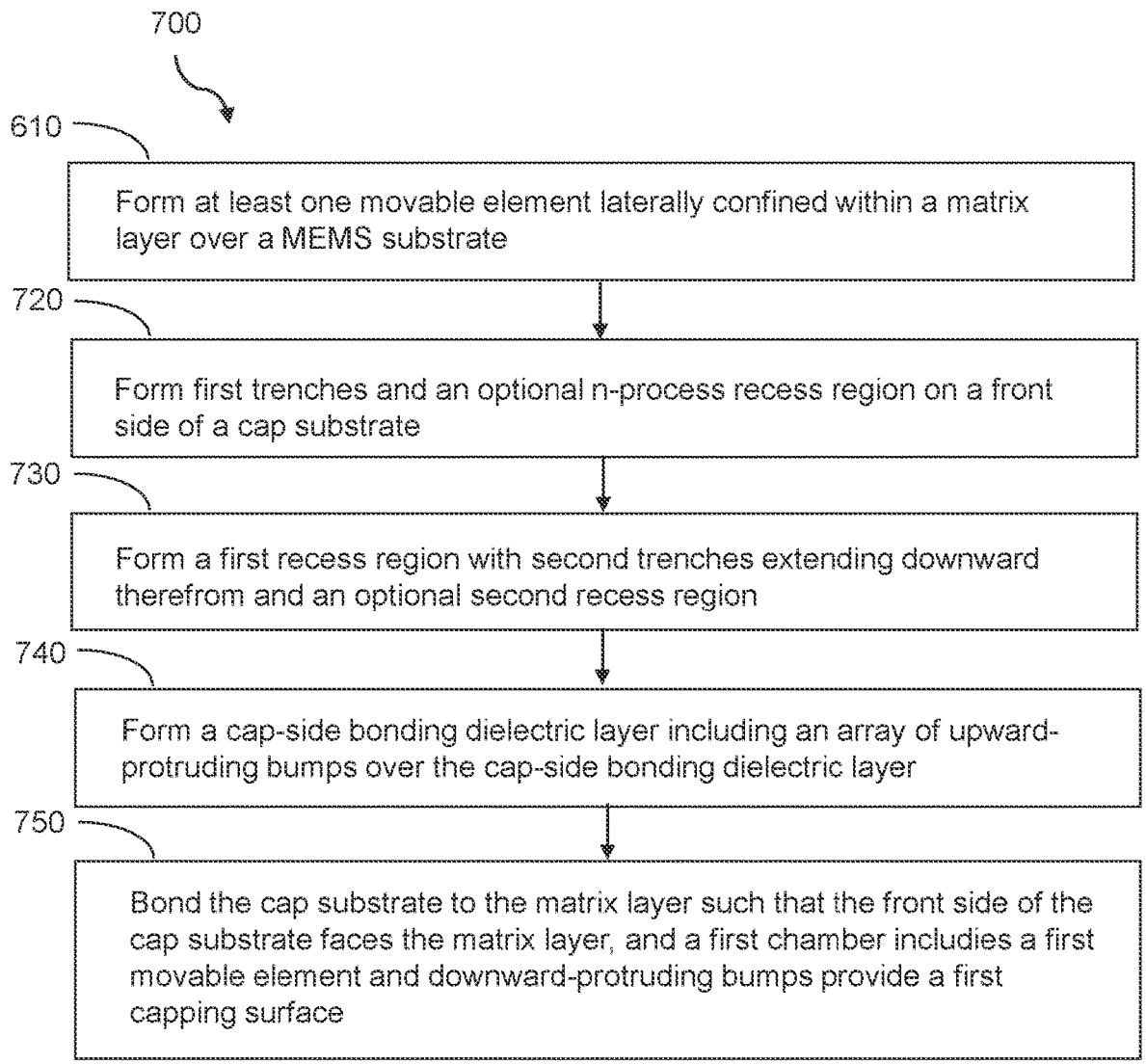
FIG. 7 is a process flow chart illustrating the operation to form a MEMS device assembly in accordance with another embodiment of the present disclosure.

FIG. 7 is a process flow diagram illustrating the operations of another embodiment method 700 to form a MEMS device 400. The MEMS device 400 can include a first MEMS device 100 and/or a second MEMS device 200, and may optionally include an additional MEMS device provided on a same MEMS substrate 50. In step 610 at least one movable element (e.g., 10a, 10b) may be formed within a matrix level 10 that overlies the MEMS substrate 50 in accordance with the process steps illustrated with reference to FIGS. 1A-1I and described in greater detail above. A matrix side bonding layer 62 located at a top surface of the matrix layer may also be formed. The at least first and second movable elements (e.g., 10a, 10b) may be formed first and set aside, formed concurrently with or formed subsequent to a cap structure.

While FIG. 7 illustrates the formation of the cap structure in steps 710-740, one of ordinary skill in the art would recognize that various embodiments may perform the disclosed steps in a variety of sequences. In step 720, first trenches 75a can be formed on a front side of a cap substrate 70. Optionally, an in-process recess region 81 may be optionally formed in step 720. In step 730, a first recess region 71a with second trenches 75b extending downward therefrom can be formed by vertically recessing a region of the cap substrate 70 that include the first trenches 75a. A recessed horizontal surface may be formed in the first recess region 71a of the cap substrate 70. Second trenches 75b that replicate a pattern of the first trenches 75a vertically extend downward from the recessed horizontal surface. A second recess region 71b can be optionally formed. In step 740, a bump-containing material layer 192 is formed over a topmost surface and in the first recess region 71a of the cap substrate 70. If the second recess region 71b is provided, the bump-containing material layer 192 is formed on all surfaces of the second recess region 71b. Portions of the bump-containing material layer 192 that overlie the second trenches 75b have an array of upward-protruding bumps 192B. In step 750, the cap substrate 70 is bonded to the matrix layer 70 such that the front side of the cap substrate 70 faces the matrix layer 10, and a first chamber 109 including a first movable element 10a selected from the at least one movable element (10a, 10b) is formed by the matrix layer 10 and the cap substrate 70, wherein a surface of the array of upward-protruding bumps 192B provides a first capping surface within the first chamber 109 after being placed upside down over the first movable element 10a during bonding Referring to all drawings and according to various embodiments of the present disclosure, a micro-electro mechanical system (MEMS) device is provided, which comprises: a MEMS substrate 50; at least one movable element (10a, 10b) laterally confined within a matrix layer 10 that overlies the MEMS substrate 50; and a cap substrate 70 bonded to the matrix layer 10, wherein a first movable element 10a selected from the at least one movable element (10a, 10b) may be located inside a first chamber 109 that may be laterally bounded by the matrix layer 10 and vertically bounded by a first capping surface that overlies the first movable element 10a, and wherein the first capping surface comprises an array of downward-protruding bumps (82B or 192B) including respective portions of a bump-containing material layer (82 or 192), which may be the bump-containing material layer 82 or the bump-containing material layer 192.

In one embodiment, each of the downward-protruding bumps (82B or 192B) may have a vertical cross-sectional profile of an inverted hillock. In one embodiment, the cap substrate 70 may comprise a vertically raised horizontal surface 70S that overlies the first chamber 109 and is vertically offset upward from a proximal horizontal surface of the cap substrate 70. The proximal horizontal surface of the cap substrate 70 overlies the matrix layer 10, and is most proximal to the matrix layer 10 selected from all surfaces of the cap substrate 70. As used herein, a proximal surface of an element refers to a surface of the element that is most proximal to the interface between the matrix-side bonding dielectric layer 62 and the bump-containing material layer (82 or 192). As used herein, a distal surface of an element refers to a surface of the element that is most distal from the interface between the matrix-side bonding dielectric layer 62 and the bump-containing material layer (82 or 192).

In one embodiment, the MEMS device comprises inverted trenches (75 or 75b) that vertically extend upward into the cap substrate 70 from the vertically raised horizontal surface 70S of the cap substrate 70 and overlie a respective one of the downward-protruding bumps (82B or 192B). In one embodiment, the MEMS device comprises voids 79 that are free of any solid phase material or any liquid phase material and contained within sidewalls of the inverted trenches (75 or 75b) and overlie a respective downward-protruding bump (82B or 192B). In one embodiment, surfaces of the inverted trenches (75 or 75b) are lined with a material of a bump-containing material layer (82 or 192), and each of the voids 79 comprises an encapsulated cavity defined by a respective continuous surface of the material of the bump-containing material layer (82 or 192) without a hole therethrough.

In one embodiment, the MEMS device comprises a matrix-side bonding dielectric layer 62 located on a top surface of the matrix layer 10. The bump-containing material layer (such as the bump-containing material layer 192) extends beneath a bottom surface of the cap substrate 70 and is bonded to the matrix-side bonding dielectric layer 62. In one embodiment, the at least one movable element (10a, 10b) comprises a second movable element 10b located inside a second chamber 209 that is vertically bounded by a second capping surface that overlies the second movable element 10b. The second capping surface comprises a portion of the bump-containing material layer (such as the bump-containing material layer 192) and has a flat bottom surface.

In one embodiment, a matrix-side bonding dielectric layer 62 is located on a top surface of the matrix layer 10. A cap-side bonding dielectric layer 72 can be located between the bump-containing material layer (such as the bump-containing material layer 82) and a vertically raised horizontal surface 70S of the cap substrate 70, can extend beneath a bottom surface of the cap substrate 70, and can be bonded to the matrix-side bonding dielectric layer 62.

In one embodiment, the array of downward-protruding bumps (82B or 192B) comprises a one-dimensional array or as a two-dimensional array. The at least one movable element (10a, 10b) and the matrix layer 10 comprise a first semiconductor material, and the cap substrate 70 comprises a second semiconductor material.

In one embodiment, a device including the first movable element 10a, the first chamber 109, and the array of downward-protruding bumps (82B, 192B) comprises an accelerometer. A device including the second movable element 10b, the second chamber 209, and the second capping surface comprises a gyroscope.

An array of downward-protruding bumps (82B or 192B) functions as a first capping surface for the first moving element, which functions as a stopping surface for the first movable element 10a. The array of downward-protruding bumps (82B or 192B) can be advantageously used to reduce the contact area when the first movable element 10a hits the first capping surface, for example, during excessive acceleration. In other words, the downward-protruding bumps (82B or 192B) provide a reduced contact area for the first movable element 10a in case the first movable element 10a collides with the first capping surface of the cap substrate. Reduction of the contact area between the first movable element 10a and the cap substrate reduces the probability that the first movable element 10a would stick to the cap substrate upon collision. By suppressing the sticking of the first movable element 10a upon contact with the cap substrate, reliability and accuracy of the MEMS device (such as an accelerometer) that includes the first movable element 10a can be enhanced. Further, in case the bump-containing material layer 192 is used, a second capping surface for a second MEMS device (such as a gyroscope) can provide a smaller contact surface to the second movable element 10b to increase the reliability and accuracy of the second MEMS device.

In one embodiment, an ambient at atmospheric pressure or at a pressure higher than the atmospheric pressure may be employed during bonding the MEMS substrate 50 to the cap substrate 70 through the bonding dielectric layers (62, 72 or 192). A nitrogen ambient or another inert ambient may be employed during bonding of the MEMS substrate 50 to the cap substrate 70. In case the bump-containing material layer 82 includes an outgassing material, gases released from the bump-containing material layer 82 during, or after, bonding of the MEMS substrate 50 to the cap substrate 70 can increase the pressure in the first chamber 109. This increased pressure may provide an advantage to increase mechanical damping of the first movable element 10a during movement of the first movable element 10a.

According to an embodiment of the present disclosure, a micro-electro mechanical system (MEMS) device is provided. The MEMS device can include a MEMS substrate 50 and one or more movable elements (10a, 10b). Each movable element (10a, 10b) is laterally confined within a matrix layer 10 that overlies the MEMS substrate 50. A cap substrate 70 is bonded to the matrix layer 10, for example, via bonding dielectric layers (62, 72 or 192). A first movable element 10a can be located inside a first chamber 109 that is laterally bounded by the matrix layer 10 and vertically bounded by a first capping surface that overlies the first movable element 10a. The first capping surface can include an array of downward-protruding bumps (82B, 192B) including respective portions of a bump-containing material layer, which may be portions of a bump-containing material layer (82, 192).

According to an embodiment of the present disclosure, a method of forming a micro-electro mechanical system (MEMS) device is provided. At least one movable element (10a, 10b) laterally confined within a matrix layer 10 can be formed over a MEMS substrate 50. A recess region 71a may be formed on a front side of a cap substrate 70. A cap-side bonding dielectric layer 72 may be formed over a topmost surface and in the recess region 71a of the cap substrate 70. Trenches 75 that extend through the cap-side bonding dielectric layer 72 may be formed into the cap substrate 70 within the recess region 71a. A bump-containing material layer 82 may be formed over the cap-side bonding dielectric layer 72. Portions of the bump-containing material layer 82 that overlie the trenches 75 form an array of upward-protruding bumps 82B. The cap substrate 70 may be bonded to the matrix layer 10 such that the front side of the cap substrate 70 faces the matrix layer 10. A first chamber 109 including a first movable element 10a may be formed by the matrix layer 10 and the cap substrate 70. A surface of the array of upward-protruding bumps 82B provides a first capping surface within the first chamber 109 after being placed upside down over the first movable element 10a during bonding.

According to an embodiment of the present disclosure, a method of forming a micro-electro mechanical system (MEMS) device is provided. At least one movable element (10a, 10b) laterally confined within a matrix layer 10 over a MEMS substrate 50 is provided. First trenches 75a may be formed on a front side of a cap substrate 70. A region of the cap substrate 70 that include the first trenches 75a may be vertically recessed. A recessed horizontal surface may be formed in a recess region 71a of the cap substrate 70, and second trenches 75b that replicate a pattern of the first trenches 75a vertically extend downward from the recessed horizontal surface. A bump-containing material layer 192 is formed over a topmost surface and in the recess region 71a of the cap substrate 70. Further, portions of the bump-containing material layer 192 that overlie the second trenches 75b have an array of upward-protruding bumps 192B. The cap substrate 70 may be bonded to the matrix layer 10 such that the front side of the cap substrate 70 faces the matrix layer 10. A first chamber 109 including a first movable element 10a may be formed by the matrix layer 10 and the cap substrate 70. A surface of the array of upward-protruding bumps 192B provides a first capping surface within the first chamber 109 after being placed upside down over the first movable element 10a during bonding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro-electro mechanical system (MEMS) device, comprising:
   a MEMS substrate;
   a first movable element laterally confined within a matrix layer that overlies the MEMS substrate; and
   a cap substrate bonded to the matrix layer and comprising a vertically raised horizontal surface overlying the first movable element, and comprising inverted trenches that vertically extend upward from the vertically raised horizontal surface into the cap substrate; and
   a bump-containing material layer that includes an array of downward-protruding bumps located underneath openings of the inverted trenches that are adjoined to the vertically raised horizontal surface of the cap substrate.

2. The MEMS device of claim 1, further comprising a first chamber that is laterally bounded by the matrix layer and vertically bounded by the bump-containing material layer and containing the first movable element therein.

3. The MEMS device of claim 1, wherein the vertically raised horizontal surface is vertically offset upward from a proximal horizontal surface of the cap substrate which overlies the matrix layer and is most proximal to the matrix layer selected from all surfaces of the cap substrate.

4. The MEMS device of claim 1, wherein each of the downward-protruding bumps has a vertical cross-sectional profile of an inverted hillock.

5. The MEMS device of claim 1, wherein the inverted trenches comprise a one-dimensional array in which a unit pattern of an inverted trench is repeated along a horizontal direction.

6. The MEMS device of claim 1, wherein the inverted trenches comprise a first array of elongated inverted trenches that laterally extend along a first horizontal direction and a second array of elongated inverted trenches that laterally extend along a second horizontal direction such that the first array and the second array intersect at cross-points.

7. The MEMS device of claim 1, further comprising voids that are free of any solid phase material or any liquid phase material and contained within sidewalls of the inverted trenches and overlie a respective downward-protruding bump.

8. The MEMS device of claim 7, wherein surfaces of the inverted trenches are lined with a material of the bump-containing material layer.

9. The MEMS device of claim 8, wherein each of the voids comprises an encapsulated cavity defined by a respective surface of the material of the bump-containing material layer without a hole therethrough.

10. The MEMS device of claim 1, further comprising a matrix-side bonding dielectric layer located on a top surface of the matrix layer, wherein the bump-containing material layer extends beneath a bottom surface of the cap substrate and is bonded to the matrix-side bonding dielectric layer.

11. A micro-electro mechanical system (MEMS) device, comprising:
- a MEMS substrate;
- at least one movable element laterally confined within a matrix layer that overlies the MEMS substrate; and
- a cap substrate bonded to the matrix layer, wherein:
- a first movable element selected from the at least one movable element is located inside a first chamber that is laterally bounded by the matrix layer and vertically bounded by a first capping surface that overlies the first movable element;
- the first capping surface comprises an array of downward-protruding bumps including respective portions of a bump-containing material layer; and
- the cap substrate comprises a vertically raised horizontal surface that overlies the first chamber,
- wherein inverted trenches vertically extend upward from a vertically raised horizontal surface of the cap substrate into the cap substrate.

12. The MEMS device of claim 11, wherein the vertically raised horizontal surface is vertically offset upward from a proximal horizontal surface of the cap substrate.

13. The MEMS device of claim 11, wherein the inverted trenches overlie a respective one of the downward-protruding bumps.

14. The MEMS device of claim 11, wherein surfaces of the inverted trenches are lined with a material of the bump-containing material layer.

15. The MEMS device of claim 11, wherein each of the downward-protruding bumps has a vertical cross-sectional profile of an inverted hillock.

16. The MEMS device of claim 11, further comprising voids that are free of any solid phase material or any liquid phase material and contained within sidewalls of the inverted trenches and overlie a respective one of the downward-protruding bumps, wherein each of the voids comprises an encapsulated cavity defined by a respective surface of the material of the bump-containing material layer without a hole therethrough.

17. A micro-electro mechanical system (MEMS) device, comprising:
- a MEMS substrate;
- at least one movable element laterally confined within a matrix layer that overlies the MEMS substrate; and
- a cap substrate bonded to the matrix layer and comprising inverted trenches therein, wherein:
- a first movable element selected from the at least one movable element is located inside a first chamber that is laterally bounded by the matrix layer and vertically bounded by a first capping surface that overlies the first movable element; and
- inverted trenches overlie the first caping surfaces and extend upward into the cap substrate.

18. The MEMS device of claim 17, wherein the first capping surface comprises an array of downward-protruding bumps including respective portions of a bump-containing material layer.

19. The MEMS device of claim 17, wherein:
- the cap substrate comprises a vertically raised horizontal surface that overlies the first chamber;
- the inverted trenches vertically extend upward from the vertically raised horizontal surface, and
- a horizontal surface of the bump-containing material layer contacts the vertically raised horizontal surface.

20. The MEMS device of claim 11, wherein the array of downward-protruding bumps is located underneath openings of the inverted trenches and has an areal overlap with the inverted trenches in a plan view.

* * * * *